United States Patent
Uekubo

(10) Patent No.: US 6,509,786 B2
(45) Date of Patent: Jan. 21, 2003

(54) BIASING CIRCUIT FOR QUICKLY OUTPUTTING STABLE BIAS OUTPUT AND SEMICONDUCTOR MEMORY DEVICE

(75) Inventor: Masaki Uekubo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/968,003

(22) Filed: Oct. 2, 2001

(65) Prior Publication Data

US 2002/0027468 A1 Mar. 7, 2002

Related U.S. Application Data

(62) Division of application No. 09/447,589, filed on Nov. 23, 1999, now Pat. No. 6,323,724.

(30) Foreign Application Priority Data

Dec. 1, 1998 (JP) ............................................ 10-341617

(51) Int. Cl.[7] .............................. G05F 1/10; G05F 3/02
(52) U.S. Cl. ...................... 327/538; 327/541; 365/185.2
(58) Field of Search ................................. 327/538, 540, 327/541, 543; 365/185.2, 185.21; 323/312, 313, 315

(56) References Cited

U.S. PATENT DOCUMENTS

| 5,041,738 A | * | 8/1991 | Walters, Jr. ................. 327/130 |
| 5,391,979 A | | 2/1995 | Kajimoto et al. ............ 323/313 |
| 5,646,887 A | * | 7/1997 | Truong et al. ................ 327/51 |
| 5,945,819 A | | 8/1999 | Ursino et al. ................ 323/282 |
| 6,191,978 B1 | * | 2/2001 | Watanabe et al. ....... 365/185.21 |

FOREIGN PATENT DOCUMENTS

| JP | 63142596 | 6/1988 |
| JP | 4353699 | 12/1992 |
| JP | 6195990 | 7/1994 |
| JP | 7169290 | 7/1995 |
| JP | 9171697 | 6/1997 |
| JP | 1083690 | 3/1998 |

* cited by examiner

Primary Examiner—Terry D. Cunningham
Assistant Examiner—Quan Tra
(74) Attorney, Agent, or Firm—Young & Thompson

(57) ABSTRACT

A biasing circuit includes an increasing circuit, a supplying circuit, a bias outputting circuit and a bias outputting circuit. The increasing circuit outputs a drive voltage, and the supplying circuit is connected in parallel to the increasing circuit and outputs a drive voltage. The bias outputting circuit outputs a bias output to a biased circuit in response to the drive voltage from the increasing circuit or the drive voltage from the supplying circuit. The control circuit controls the increasing circuit and the supplying circuit based on the bias output from the bias outputting circuit.

6 Claims, 13 Drawing Sheets

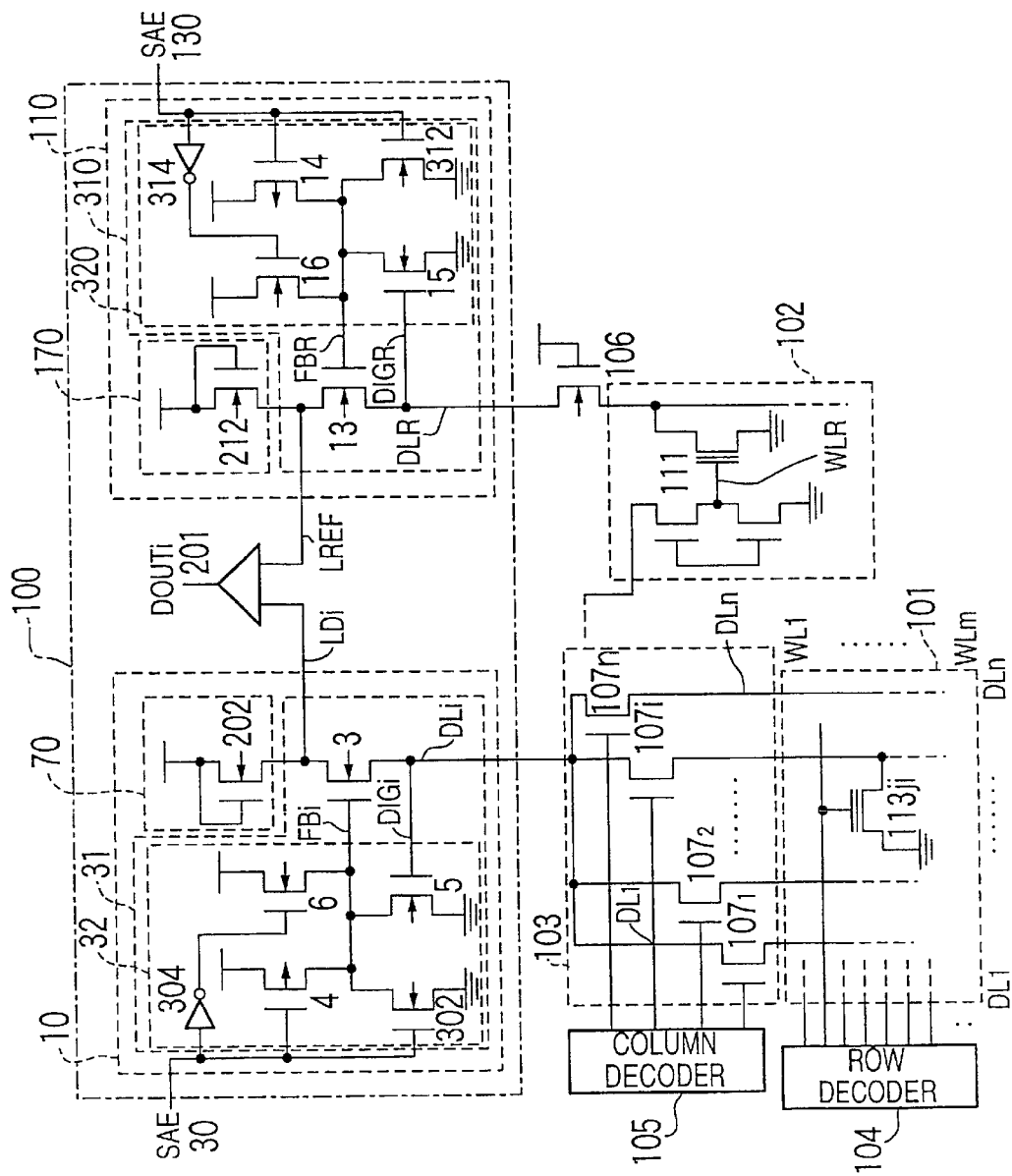

US 6,509,786 B2

1

BIASING CIRCUIT FOR QUICKLY OUTPUTTING STABLE BIAS OUTPUT AND SEMICONDUCTOR MEMORY DEVICE

This application is a division of application Ser. No. 09/447,589, filed on Nov. 23, 1999, now U.S. Pat. No. 6,323,724 the entire contents of which are hereby incorporated by reference.

BACKGROUND OF THE INVENTION

1. Field of the Invention

The present invention relates to a biasing circuit and a semiconductor memory device using the same. More particularly, the present invention relates to a biasing circuit for quickly outputting a stable bias output, and a semiconductor memory device using the same.

2. Description of the Related Art

Conventionally, in a semiconductor memory device, it is important that an access time required to read and write a data is made short so that the whole computer system can be speeded up.

In a conventional semiconductor memory device such as s nonvolatile memory and a ROM, a data of 1 bit is stored in a memory cell. A predetermined bias voltage is applied to the drain of a transistor in the memory cell when the stored data should be read out. At this time, the stored data is determined to be "0" or "1" based on whether or not a drain current is larger than a predetermined value. Generally, the drain voltage is increased as the drain current of the transistor becomes larger. Therefore, if the bias voltage applied to the drain of the memory cell transistor is not stable when the stored data should be read out, the drain current is also not stable. As a result, it is not possible to correctly determine whether the drain current is larger than the predetermined value.

In recent years, the data is sometimes stored in the memory cell in the form of multiple bits, e.g., in the form of 4 bits. In such a multi-bit memory device, the stored data is determined based on the small difference in the drain current. Therefore, the bias voltage applied to the drain of the memory cell transistor must be strictly set to a predetermined value. For this purpose, the performance of the sense amplifier is given as one of the important factors to determine the access time of the semiconductor memory device. For this reason, various studies have been accomplished so far. For example, the improvement of a sense amplifier for an EPROM is disclosed in Japanese Laid Open Patent Application (JP-A-Showa 63-142596) and Japanese Laid Open Patent Application (JP-A-Heisei 4-353699).

The structures of conventional semiconductor memory devices will be described with reference to FIGS. 1 and 2. FIGS. 1 and 2 are circuit diagrams showing examples of the structures of sense amplifier circuits 100 provided in the conventional semiconductor memory devices.

For example, the conventional semiconductor memory device is a nonvolatile memory which uses a floating gate type MOSFET as a memory cell, as shown in FIG. 1. The conventional semiconductor memory device is composed of a memory cell array 101 for data storage. Digit lines $DL_1$ to $DL_n$ are increased in potential from the ground potential to a predetermined potential so that a data can be read out from the memory cell array 101 by the sense amplifier circuit 100. The sense amplifier circuit 100 is composed of a sense circuit 10, a reference circuit 110, and a data detecting circuit 201.

2

Also, the memory cell array 101 is composed of a plurality of word lines $WL_1$ to $WL_m$ provided in a row direction and the plurality of digit line $DL_1$ to $DL_n$ provided into a column direction. Each of memory cells $113_{11}$ to $113_{1n}$, ..., $113_{m1}$ to $113_{mn}$ is composed of a floating gate type MOSFET and is provided for one of intersections of the plurality of word lines $WL_1$ to $WL_m$ and the plurality of digit line $DL_1$ to $DL_n$. That is, the memory cells of m rows and n columns are arranged in a matrix in the memory cell array 101. The floating gate type MOSFET as the memory cell $113_{ji}$ (j=1 to m, i=1 to n) is connected with the j-th one of the word lines $WL_1$ to $WL_m$ at the gate and with the i-th one of the digit lines $DL_1$ to $DL_n$ at the drain, and is connected with the ground potential in the source.

Also, a reference cell array 102 is composed of one reference word line WLR provided in a row direction and one reference digit line DLR provided in a column direction. One reference cell 111 with the same structure as the memory cell $113_{ji}$ is provided at an intersection of the reference word line WLR and the reference digit line DLR. The reference cell 111 is connected with the reference word line WLR at the gate, and with reference digit line DLR at the drain and is connected with the ground potential at the source. In this example, the reference word line WLR and the reference DLR are provided to the reference cell array 102, and only one MOSFET is provided as the reference cell 111.

A row decoder 104 is connected with the word lines $WL_1$ to $WL_1$ in the memory cell array 101 and the column decoder 105 is connected to a column selector 103. The row decoder 104 and the column decoder 103 are supplied with an address signal (not shown). The row decoder 104 activates one of the word lines $WL_1$ to $WL_m$ directly in accordance with the address signal. Also, the column decoder 103 connects one of the digit lines $DL_1$ to $DL_n$ with the sense amplifer circuit 100 through the column selector 103 in accordance with the address signal.

The column selector 103 is composed of MOSFETs $107_1$ to $107_n$ for carrying out digit line selection in response to the output of the column decoder 105 such that one of digit lines $DL_1$ to $DL_n$ is selectively connected with the sense circuit 10. The sources of the MOSFETs $107_1$ to $107_n$ in the column selector 103 are connected with the respective digit lines $DL_1$ to $DL_n$, and the drains thereof is commonly connected to the sence circuit 10 provided in the sense amplifier circuit 100.

Further, in the semiconductor memory device, one biasing circuit 20 is provided in the sence circuit 10 for the plurality of digit lines $DL_1$ to $DL_n$. Also, one MOSFET 106 with the same size as MOSFETs $107_1$ to $107_n$ of the column selector 103 is connected with the reference digit line DLR. The gate of the MOSFET 106 is connected with the power supply voltage. The drain of the MOSFET 106 which is provided for the reference cell array 102, is connected with the reference circuit 110.

In FIGS. 1 and 2, the word line $WL_j$ is selected by the row decoder 104 and the digit line $DL_i$ is selected by the column decoder 105 through the column selector 103. The case to sense a stored data of the memory cell $113_{ji}$ which is connected with the word line $WL_j$ and the digit line $DL_i$ will be described as an example.

As shown in FIG. 1, the output terminals of the sense circuit 10 and reference circuit 110 are connected with a data detecting circuit 201 through signal lines $LD_i$ and LREF, respectively. The data detecting circuit 201 compares a detection voltage $VD_i$ on the signal line $LD_i$ and a reference voltage VREF on the signal line LREF, and determines the stored data of the selected memory cell. An output buffer (not shown) is connected on the output side of the data detecting circuit 201 and outputs the stored data from the data detecting circuit 201.

The memory cells $113_{ji}$ ($113_{11}$ to $113_{in}$, ..., $113_{m1}$ to $113_{mn}$) and 111 of the nonvolatile memory store data based on whether or not electrons are injected to the floating gate. When the stored data of memory cell $113_{ji}$ should be read, a predetermined voltage is applied to the memory cell $113_{ji}$ by the biasing circuit 20 in the sense circuit 10. As a result, the stored data is determined based on whether or not a current flows through the selected memory cell $113_{ji}$. That is, in the memory cell in which electrons have been injected to the floating gate, the drain current does not flow even if a signal with a high level is supplied to the gate when the memory cell $113_{ji}$ is set to a selected state. Oppositely, in the memory cell in which the electrons are pulled out of the floating gate, the drain current flows when the signal with the high level is supplied to the gate of the memory cell transistor in the cell 113ji in the selected state. On the other hand, a predetermined reference current always flows through the reference cell 111 which is provided in the reference cell array 102, because electrons are not injected or a predetermined quantity of electrons are injected.

As described above, in the conventional example of the nonvolatile memory, it corresponds to the stored data of "1" that electrons are injected to the floating gate, and it corresponds to the stored data of "0" that electrons are pulled out from the floating gate. However, sometimes there is a case opposite to the above.

An N-channel transistor 212 of the reference circuit 110 and an N-channel transistor 202 in the sense circuit 10 operate as load resistances. The N-channel transistors 212 and 202 convert the currents flowing through the reference digit line DLR and the digit line $DL_i$ into the voltages to be supplied to the data detecting circuit 201, respectively. Generally, the current supply capability of the transistor 212 is set larger than the current supply capability of the transistor 202. Even if the current with the same magnitude flows through each of the reference the digit line DLR and the digit line $DL_i$, the voltage drop in the transistor 202 is larger than that in the transistor 212.

Now, it is supposed that the voltage generated in the drain of the transistor 212 by the reference current which flows through the reference cell 111 is a reference voltage VREF. Also, it is supposed that the detection voltages $VD_i$ generated in the transistor 202 by the current which flows through the memory cell $113_{ji}$ in the on or off state are $VD_{ion}$ or $VD_{ioff}$. At this time, the reference voltage VREF is generally set to be a middle voltage between the reference voltages $VD_{ioff}$ and $VD_{ion}$. Therefore, if the detection voltage $VD_i$ is higher than the reference voltage VREF, the data detecting circuit 201 determines the memory cell $113_{ji}$ to be in the off state of the data of "0". Also, oppositely, if the detection voltage $VD_i$ is lower than the reference voltage VREF, the data detecting circuit 201 determines the memory cell $113_{ji}$ to be in the on state of the data of "1". Based on this determining result, the data detecting circuit 201 outputs a read data $DOUT_i$.

As shown in FIG. 1, the biasing circuit 20 supplies a bias voltage to the digit line $DL_i$ when a sense amplifier operation enable signal SAE 30 is in a low level. Also, the biasing circuit 20 stops the supply of the bias voltage when the sense amplifier operation enable signal SAE 30 is in the high level. The biasing circuit 120 on the side of the reference digit line DLR operates in the same way.

The sense amplifier operation enable signal SAE 30 is used for the purpose that the bias voltage is supplied to the digit line $DL_i$ only in the reading operation. As a result, the period during which the current flows through the memory cell $113_{ji}$ is made short, resulting in reduction of the power consumption of the semiconductor memory device. Thus, the sense amplifier operation enable signal SAE 30 is not a signal indispensable for the reading operation.

When the row decoder 104 activates the word line $WL_j$, the memory cell $113_{ji}$ is left in the off state in which electrons are injected, i.e., the stored data is "1". Therefore, no current flows through the digit line $DL_i$. As a result, the detection voltage $VD_i$ is set to the voltage $VD_{ioff}$ which is higher than the reference voltage VREF. Oppositely, when electrons are pulled out from the selected memory cell $113_{ji}$, i.e., when the stored data is "0", the memory cell $113_{ji}$ is set to the on state and the detection voltage $VD_i$ is set to the voltage $VD_{ion}$ which is lower than the reference voltage VREF. The voltage difference between the reference voltage VREF and the detection voltage $VD_{ion}$ is detected by the data detecting circuit 201 as mentioned above. That is, the data detecting circuit 201 determines that the memory cell is in the state that electrons are injected to the floating gate of the memory cell $113_{ji}$, i.e., the stored data of the memory cell $113_{ji}$ is "1", when $VD_i$ (=$VD_{ioff}$)>VREF. On the other hand, the data detecting circuit 201 determines that electrons are pulled out from the floating gate of the memory cell $113_{ji}$, i.e., that the stored data of the memory cell $113_{ji}$ is "0", when $VD_i$ (=$VD_{ion}$)<VREF.

Next, the sense amplifier circuit 100 provided in the semiconductor memory device shown in FIG. 1 will be described. The sense amplifier circuit 100 is composed of the sense circuit 10, the reference circuit 110 and the data detecting circuit 201. The sense circuit 10 is activated in response to the sense amplifier operation enable signal SAE 30 to supply a first predetermined voltage to the digit line $DL_i$. The sense circuit 10 generates the detection voltage $VD_i$ based on the read data from the selected memory cell $113_{ji}$. The sense circuit 10 is composed of the biasing circuit 20 which supplies a second predetermined voltage to the digit line DLR and a load section 70 connected with the biasing circuit 20. The biasing circuit 20 is composed of a feed-back circuit 40 and an N-channel transistor 203. The feed-back circuit 40 is composed of a P-channel transistor 204 and N-channel transistors 205 and 302. The source of the P-channel transistor 204 is connected with the power supply voltage and the drain thereof is connected with the drains of the N-channel transistors 205 and 302. The sources of the N-channel transistors 205 and 302 are grounded.

Also, the sense amplifier operation enable signal SAE 30 is supplied to the gates of the P-channel transistor 204 and N-channel transistor 302. The sense amplifier operation enable signal SAE 30 is set to the high level in the state other than the reading operation, so that the transistor 204 is set to the off state and the transistor 302 is set to the on state. Therefore, the signal line $FB_i$ is set to the low level and the digit line $DL_i$ is also set to the low level. The sense amplifier operation enable signal SAE 30 is set to the low level during the reading operation. Therefore, the transistor 204 is turned on and the transistor 302 is turned off. As a result, the signal line $FB_i$ is set to a third predetermined voltage and the digit line $DL_i$ is also biased to the first predetermined voltage.

Since the transistor 203 operates as a source follower when the signal line $FB_i$ is set to the first predetermined voltage, the transistor 203 outputs the voltage VD0 as much as the level of signal line $FB_i$. The voltage VD0 is supplied to the gate of the N-channel transistor 205 so that the transistor 205 passes a predetermined quantity of current. Because the transistor 205 passes a quantity of current more than the predetermined current when the voltage on the digit line $DL_i$ is higher than the third predetermined voltage, the transistor 205 decreases the voltage on the signal line $FB_i$. When the voltage on the signal line $FB_i$ is decreased, the transistor 203 decreases the voltage on the digit line $DL_i$. Oppositely, because the transistor 205 passes a quantity of current which are fewer than the predetermined quantity of current when the voltage on the digit line $DL_i$ is lower than the third predetermined voltage, the transistor 205 increases the voltage on the signal line $FB_i$. When the voltage on the signal line $FB_i$ is increased, the transistor 203 increases the voltage on the digit line $DL_i$. In this way, the biasing circuit 20 make the digit line $DL_i$ settle to the third predetermined bias voltage, even if the voltage on the digit line $DL_i$ changes.

Also, the load section 70 is composed of the N-channel transistor 202. Because the drain of the N-channel transistor 202 and the gate thereof are connected with the power supply voltage, the N-channel transistor 202 operates as a constant current circuit. An output from the feed-back circuit 40 is supplied to the gate of the N-channel transistor 203 so that the drain of the memory cell $113_{ji}$ is biased to the third predetermined voltage. As a result, the predetermined quantity of drain current flows through the memory cell $113_{ji}$ so that the detection voltage $VD_i$ is generated in the load section 70.

On the other hand, the reference circuit 110 supplies the reference digit line DLR with a fourth predetermined voltage and generates the reference voltage VREF based on the data of the reference cell 111. The reference circuit 110 is composed of the reference biasing circuit 120 which supplies the reference digit line DLR with a fourth predetermined voltage and the load section 170 which is connected with the reference biasing circuit 120. The reference biasing circuit 120 and the load section 170 have the same structures as those of the biasing circuit 20 and load section 70 in the sense circuit 10, respectively. That is, the reference biasing circuit 120 is composed of a feed-back circuit 140 and an N-channel transistor 213.

The feed-back circuit 140 is composed of a P-channel transistor 214 and N-channel transistors 215 and 312. Also, the load section 170 is composed of an N-channel transistor 212. A transistor having a resistance smaller than the N-channel transistor 202 in the sense circuit 10 is used as the N-channel transistor 212. Thus, the load section 170 is set to the middle voltage between the detection voltage of the memory cell 113 in the on state and the detection voltage of the memory cell $113_{ji}$ in the off state. The reference biasing circuit 120 biases the reference bit line LDR to a predetermined voltage when the sense amplifier operation enable signal SAE 130 is supplied to the gates of the P-channel transistor 214 and N-channel transistor 312 in the feed-back circuit 140 so that the feed-back circuit 140 operates.

Next, the biasing circuit 20 in the sense circuit 10 which is provided in the sense amplifier circuit 100 of the semiconductor memory device shown in FIG. 1 will be described in detail.

As mentioned above, in the biasing circuit 20, when the sense amplifier operation enable signal SAE 30 is set to the low level in case of the reading operation, the P-channel transistor 204 is set to the on state, so that the voltage on the signal line $FB_i$ is increased. Also, the source of the N-channel transistor 203, i.e., the voltage of the digit line $DL_i$ is set to voltage corresponding to the voltage on the signal line $FB_i$. In response to the set voltage, the current is fed back to the gate of the N-channel transistor 205 so that a predetermined quantity of current flows through the N-channel transistor 205. Therefore, the voltage on the signal line $FB_i$ converges to the first predetermined voltage. Because the voltage on the signal line $FB_i$ is biased to the first predetermined voltage, the voltage on the digit line $DL_i$ is biased to the third predetermined voltage. Also, the biased voltage is applied to the memory cell $113_{ji}$. This is a precharging process.

The detection voltage $VD_i$ corresponding to the current which flows through the memory cell $113_{ji}$ is outputted from the data detecting circuit 201. At this time, in the reference biasing circuit 120, the sensing of the voltage difference between the detection voltage $VD_i$ and the reference voltage VREF is carried out in the data detecting circuit 201 because the increasing operation of the voltage on the reference digit line DLR is carried out and the reference voltage VREF is outputted from the data detecting circuit 201. This operation is a sensing process.

In a case where the content of the memory cell $113_{ji}$ is "1", when the sense amplifier operation enable signal SAE 30 is set to the low level, the voltage of the load section 70 is set to the voltage $VD_{ioff}$ which is higher than the reference voltage VREF through the abovementioned operation. On the other hand, in a case where the stored data of "0" is read, because electrons are pulled out from the floating gate of the memory cell which is connected with the digit line $DL_i$, the current flows through the memory cell. Therefore, the voltage drops are caused in the load section 70. The voltage of the load section 70 is set to the detection voltage $VD_{ion}$ which is lower than the reference voltage VREF.

On the other hand, because the memory cell 106 connected with the digit line DLR is set to the state of "0" in the reference circuit 110, current flows through the N-channel transistor 212 so that the voltage drop is caused. Here, because the N-channel transistor 212 has the resistance smaller than the N-channel transistor 202, the reference voltage VREF is set to the middle voltage between the detection voltages $VD_{ioff}$ and $VD_{ion}$.

As a result, when the stored data of "1" of the memory cell $113_{ji}$ in the memory cell array 101 should be read, the data detecting circuit 201 outputs "0" as the output $DOUT_i$, because the detection voltage $VD_i$ is higher than the reference voltage VREF ($VD_i=VD_{ioff}$). On the other hand, when the stored data "0" of the memory cell $113_{ji}$ in the memory cell array 101 should be read, the data detecting circuit 201 outputs the data of "1", because the read voltage $VD_i$ is lower than the reference voltage VREF ($VD_i=VD_{ion}$).

Also, the second conventional example of the semiconductor memory device is shown in FIG. 2. The second conventional example of the semiconductor memory device shown in FIG. 2 has approximately the same structure as that of the sense amplifier circuit 100 in the first conventional example of the semiconductor memory device shown in FIG. 1. However, inverters 208 and 218 are provided in the input terminals of the sense circuit 10 and reference circuit 110 for the sense amplifier operation enable signal SAE 30, respectively. Also, in the biasing circuit 20 and 120, N-channel transistors 206 and 216 are provided to the output terminals of the inverters 208 and 218 instead of the P-channel transistors 204 and 214, unlike the sense amplifier circuit 100 of FIG. 1. These points are different between the first and second conventional examples.

However, in the conventional semiconductor memory devices shown in FIG. 1 and FIG. 2, there are the following problems. That is, as described above, the performance improvement of the sense amplifier circuit is needed to respond to the high speed access of the semiconductor memory device. As a method to attempt the performance improvement of the sense amplifier circuit, there is the high efficiency and stabilization of the biasing circuit provided in the sense amplifier circuit. In the biasing circuit 20 of the sense circuit 10 provided in the sense amplifier circuit 100 of the conventional semiconductor memory device shown in FIG. 1, the P-channel transistor 204 is provided on the side of power supply voltage Vcc. When the P-channel transistor is used in the operation range of the above-mentioned biasing circuit, the voltage drop between the drain and the source is generally large to a small change of drain current. For this reason, when the P-channel transistor 204 is used on the side of power supply voltage Vcc in the biasing circuit 20 of the sense circuit 10, the load differential resistance becomes large so that the amplitude of the voltage on the signal line $FB_i$ becomes large.

Also, the source voltage ($FB_i$) of the transistor 204 is set to approximately 0 V immediately after the reading operation is started, and the high level voltage of Vcc is supplied to the gate as the signal SAE. Also, the voltage difference between the gate and the source in the transistor 204 is about Vcc. Therefore, the transistor 204 operates at maximum drain current drive ability. Thus, the precharging process can be carried out at high speed to increase the degit line $DL_i$ to the third predetermined voltage.

However, in the conventional biasing circuit 20 shown in FIG. 1, because the P-channel transistor 204 is provided on the side of the power supply voltage, the biasing circuit 20 responds sensitively to change of the voltage on the digit line $LD_i$ due to noise. For this reason, it is difficult to stably carry out the sensing operation in which the data detecting circuit 201 compares the detection voltage $VD_i$ and the reference voltage VDREF. Also, there is a risk that the data detecting circuit 201 erroneously determines the stored data depending on the noise quantity. Moreover, because it takes a long time until the detection voltage $VD_i$ is stabilized in the sense circuit 10 when the degit line $DL_i$ is increased at high speed to the third predetermined voltage, the access time became rather long.

On the other hand, in the sense amplifier circuit 100 provided in the conventional semiconductor memory device shown in FIG. 2, the N-channel transistor 206 is provided on the side of power supply voltage Vcc in the biasing circuit 20 of the sense circuit 10. In the N-channel transistor 206, the variation of the voltage drop between the drain and the source is small to the small change of the drain current. Therefore, even if the voltage on the digit line $LD_i$ changes due to noise so that the influence of the voltage change is fed back via the N-channel transistor 205, the change of the voltage on the signal line $FB_i$ is small, compared with the sense circuit 10 in the semiconductor memory device shown in FIG. 1. Therefore, the sensing operation of the sense circuit 10 shown in FIG. 2 is not prevented.

However, if the N-channel transistor 206 is arranged on the side of the power supply voltage, the output of the feed-back circuit 40 shown in FIG. 2 is set to a voltage lower than the power supply voltage Vcc by the threshold voltage (VTN) of the transistor 206. Therefore, the voltage between the gate and the source in the transistor 206 becomes small so that the current drive ability of the transistor 206 is decreased. Therefore, the gate of the transistor 203 can not be rapidly increased in voltage. Moreover, the amplitude of the voltage on the signal $FB_i$ of the feed-back circuit 40 is limited to the level of about (Vcc to VTN) as the upper limit.

Also, the transistor 203 can not carry out the precharging operation to the digit line $LD_i$ at high speed. As a result, it takes a long time to increase the voltage to a voltage level sufficient for the data detecting circuit 201 to carry out the sensing operation of the detection voltage $VD_i$ and the reference voltage VREF. As a result, the reading operation of the data from the memory cell $113_{ji}$ becomes late.

In addition, in recent years, the power supply voltage Vcc of the semiconductor memory device is made low for consumption power saving in the whole semiconductor memory device. Therefore, the influence of the voltage drop due to the threshold voltage VTN became larger, compared with the conventional semiconductor memory device. For example, the influence of the voltage drop due to the above-mentioned threshold voltage VTN is larger, when the power supply voltage is set to 3 V, compared with the influence of the voltage drop due to the threshold voltage VTN, when the conventional power supply voltage Vcc is set to 5 V.

The above problems cause further increase of the time required for the detection voltage $VD_i$ to reach an enough voltage for the sensing operation and the time required to determine the stored data of the memory cell $113_{ji}$ by the data detecting circuit 201.

Also, as a memory capacity is increased, the semiconductor memory device has been a larger size, so that the wiring line length in the chip of the semiconductor memory device becomes long Thus, the parasitic capacity and wiring resistance of the wiring line are increased. In the conventional biasing circuit, there is the contradiction that the stability of the stationary state is broken, when the wiring line with a large parasitic capacity is tried to rapidly increase, and the voltage increasing characteristic is degraded when the stability of the wiring line is tried to be improved.

SUMMARY OF THE INVENTION

Therefore, an object of the present invention is to provide a semiconductor memory device with a biasing circuit which can increase a bias output rapidly to a predetermined voltage.

Another object of the present invention is to provide a semiconductor memory device with a biasing circuit, in which the bias output can be rapidly stabilized.

Still another object of the present invention is to provide a semiconductor memory device with a biasing circuit, in which the reading operation of a stored data can be speeded up.

In order to achieve an aspect of the present invention, a biasing circuit includes an increasing circuit, a supplying circuit, a bias outputting circuit and a bias outputting circuit. The increasing circuit outputs a drive voltage, and the supplying circuit is connected in parallel to the increasing circuit and outputs a drive voltage. The bias outputting circuit outputs a bias output to a biased circuit in response to the drive voltage from the increasing circuit or the drive voltage from the supplying circuit. The control circuit controls the increasing circuit and the supplying circuit based on the bias output from the bias outputting circuit.

The increasing circuit includes a P-channel transistor having a source which is operatively connected to a power supply potential, a gate which is operatively connected to a ground potential, and a drain which is operatively connected to the bias outputting circuit. The supplying circuit includes an N-channel transistor having a drain which is operatively connected to the power supply potential, a gate which is operatively connected to the power supply potential, and a source which is operatively connected to the bias outputting circuit. The P-channel transistor and the N-channel transistor are connected in parallel.

The control circuit may include an N-channel control transistor having a drain which is connected to the increasing circuit and the supplying circuit, a gate which is operatively connected to the bias output from the bias outputting circuit, and a source which is operatively connected to a ground potential. In this case, the control circuit may further include a comparator which compares a reference voltage and the bias output. The comparator connects the gate of the P-channel transistor with the ground potential without connecting the gate of the N-channel transistor with the power supply potential when the bias output is lower than the reference voltage, and connects the gate of the N-channel transistor with the power supply potential and disconnects the gate of the P-channel transistor from the ground potential when the bias output is higher than the reference voltage.

Also, the biasing circuit may further include a timer connecting the gate of the P-channel transistor with the ground potential in response to a control signal, and after a predetermined time, disconnecting the gate of the P-channel transistor from the ground potential and connecting the gate of the N-channel transistor with the power supply potential.

Also, the P-channel transistor may be turned on and the N-channel transistor may be turned off for a first period before the bias output reaches a reference voltage, and the P-channel transistor may be turned off and the N-channel transistor may be turned on for a second period following the first period.

Alternatively, the P-channel transistor maybe major to the N-channel transistor in the drive voltage for a first period before the bias output reaches a reference voltage, and the P-channel transistor may be minor to the N-channel transistor in the drive voltage for a second period following the first period. Thus, change from the P-channel transistor to the N-channel transistor may be gradually carried out. In this case, the P-channel transistor and the N-channel transistor may be different from each other in size. Also, a current ratio of the P-channel transistor to the N-channel transistor is in a range of 1:3 to 1:5.

Also, the gate of the P-channel transistor may be connected to a control signal which is active low. The supplying circuit may further include a second P-channel transistor having a source which is connected to the power supply potential, a gate which is operatively connected to the control signal, and a drain which is operatively connected to the drain of the N-channel transistor.

Alternatively, when the gate of the P-channel transistor is connected to a control signal which is active low, the supplying circuit may further include an inverter inverting the control signal to connect to the gate of the N-channel transistor.

Also, the control circuit feeds back a first gain when a difference between the bias output and a predetermined voltage is larger than a first voltage and feeds back a second gain smaller than the first gain when the difference between the bias output and a predetermined voltage is smaller than the first voltage.

In order to achieve another aspect of the present invention, a semiconductor memory device includes a memory cell connected with a word line and a digit line via a control circuit, an N-channel bias transistor and a drive circuit. The N-channel bias transistor supplies the memory cell via the control circuit with a bias voltage on the digit line to in response to a drive voltage when the word line is activated. The drive circuit includes a P-channel transistor and an N-channel transistor connected to each other -in parallel, and supplies the drive voltage to the bias transistor by the P-channel transistor and the N-channel transistor.

The P-channel transistor may have a source which is operatively connected to a power supply potential, a gate which is operatively connected to a ground potential, and a drain which is operatively connected to the bias outputting circuit. Also, the N-channel transistor may have a drain which is operatively connected to the power supply potential, a gate which is operatively connected to the power supply potential, and a source which is operatively connected to the bias outputting circuit.

The drive circuit may further includes an N-channel control transistor having a drain which is connected to the drain of the P-channel transistor and the source of the N-channel transistor, a gate which is operatively connected to the bias voltage from the bias transistor, and a source which is operatively connected to a ground potential.

Also, the P-channel transistor may be turned on when the bias voltage is much lower than a predetermined voltage and the N-channel transistor may be turned on when the bias voltage is substantially the same as the predetermined voltage.

Also, when an operation period of the drive circuit includes a first period and a second period following the first period, the P-channel transistor is major to the N-channel transistor in the drive voltage for the first period and the P-channel transistor is minor to the N-channel transistor in the drive voltage for the second period, and change from the P-channel transistor to the N-channel transistor is gradually carried out. In this case, the P-channel transistor and the N-channel transistor are different from each other in size. Also, a current ratio of the P-channel transistor to the N-channel transistor may be in a range of 1:3 to 1:5.

Also, when the gate of the P-channel transistor is connected to a control signal which is active low, the supplying circuit may further include a second P-channel transistor having a source which is connected to the power supply potential, a gate which is operatively connected to the control signal, and a drain which is operatively connected to the drain of the N-channel transistor.

Alternatively, when the gate of the P-channel transistor is connected to a control signal which is active low, the supplying circuit further includes an inverter inverting the control signal to connect to the gate of the N-channel transistor.

Also, the drive circuit feeds back a first gain when a difference between the bias output and a predetermined voltage is larger than a first voltage and feeds back a second gain smaller than the first gain when the difference between the bias output and a predetermined voltage is smaller than the first voltage.

BRIEF DESCRIPTION OF THE DRAWINGS

FIG. 13 is a circuit diagram showing the semiconductor memory device containing the biasing circuit according to the sixth embodiment of the present invention.

DESCRIPTION OF THE PREFERRED EMBODIMENTS

Hereinafter, a semiconductor memory device with a biasing circuit of the present invention will be described below in detail with reference to the attached drawings.

Figure 3:
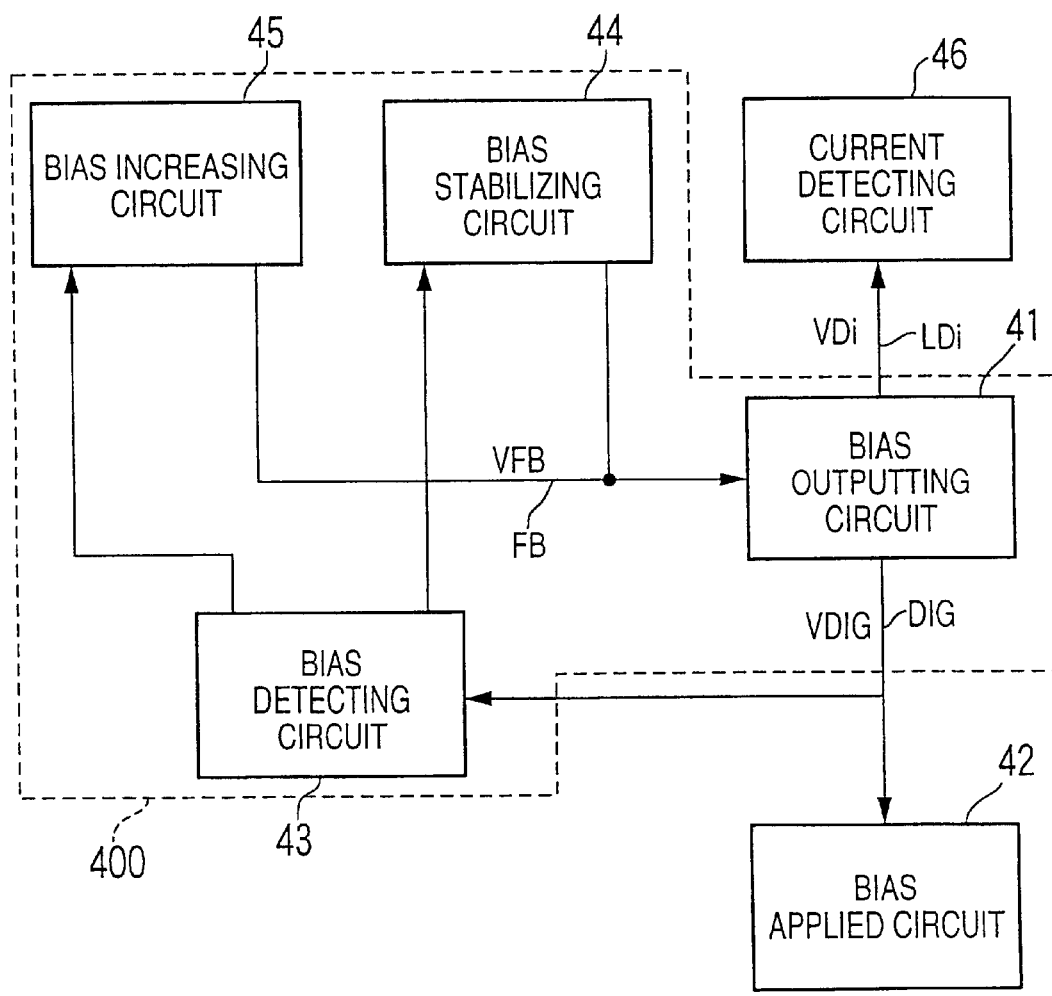
FIG. 3 is a circuit diagram showing a biasing circuit according to a first embodiment of the present invention.

FIG. 3 is a block diagram of a semiconductor memory device with a biasing circuit 400 according to the first embodiment of the present invention. The biasing circuit 400 in the first embodiment is composed of a bias outputting circuit 41, a bias detecting circuit 43, a bias stabilizing circuit 44 and a bias increasing circuit 45. Also, the voltages outputted through a signal lines $LD_i$, DIG and FB are referred to as a detection voltage $VD_i$, a bias voltage VDIG, and a drive voltage VFB, respectively. Also, the biasing circuit 400 is connected with a bias applied circuit 42 and a load circuit 46. The biasing circuit 400 supplies a predetermined bias voltage VDIG from the bias outputting circuit 41 to the bias applied circuit 42. As a result, a quantity of current which flows through the bias applied circuit 42 is detected by use of the load circuit 46. The load circuit 46 converts the quantity of current into the voltage $VD_i$.

The bias detecting circuit 43 detects the bias voltage VDIG which is supplied from the bias outputting circuit 41 to the bias applied circuit 42. When the detected bias voltage VDIG does not reach the predetermined voltage, the bias detecting circuit 43 drives the bias increasing circuit 45 to increase the drive voltage rapidly. Also, when the detected bias voltage VDIG reaches the predetermined voltage, the bias detecting circuit 43 drives the bias stabilizing circuit 44 to reduce the change of bias voltage VDIG.

When the bias voltage VDIG does not reach the predetermined voltage, the bias increasing circuit 45 outputs the bias drive voltage VFB0 on the signal line FB to the bias outputting circuit 41 based on a start signal from the bias detecting circuit 43. The bias drive voltage VFB0 functions to increase an output voltage from the bias outputting circuit 41 more than the stationary state. Therefore, the biasing circuit 400 increases the bias voltage VDIG rapidly to the predetermined voltage. It should be noted that the bias increasing circuit 45 may stop the operation or be made to decrease the bias drive ability to the bias outputting circuit 41, when the bias voltage VDIG reaches the predetermined voltage.

When the bias voltage VDIG reaches the predetermined voltage, the bias stabilizing circuit 44 generates and outputs a bias drive voltage VFB1 to the bias outputting circuit 41 based on a comparing result of the bias voltage VDIG with the predetermined voltage by the bias detecting circuit 43. Here, the gain of the feedback loop is set in such a manner that the gain of the bias stabilizing circuit 44 is. smaller than that of the bias increasing circuit 45. For this reason, even when some reason changes the bias voltage VDIG, the change of the bias drive voltage VFB1 outputted from the bias stabilizing circuit 44 is set to be small. As a result, the change of the the bias voltage VDIG as the output of the bias outputting circuit 41 also becomes small. It should be noted that the bias stabilizing circuit 44 may stop the operation or may decrease the bias drive ability to the bias outputting circuit 41, when the bias voltage VDIG does not reach the predetermined voltage.

In this way, the semiconductor memory device with the biasing circuit 400 according to the first embodiment is composed of the bias increasing circuit 45 and the bias stabilizing circuit 44 as the circuits which drive the bias outputting circuit 41, and which are switched based on the value of the bias voltage VDIG as the output voltage of the biasing circuit 400. By this, the biasing circuit 400 according to the first embodiment has the optimal performance and efficiency in the initial bias increasing state and in the stationary state.

Also, because the stable bias voltage VDIG with less influence of external disturbance can be supplied to the bias applied circuit 42 in the stationary state, the load circuit 46 can detect the current which flows through the bias applied circuit 42 in the stable condition.

Figure 4:
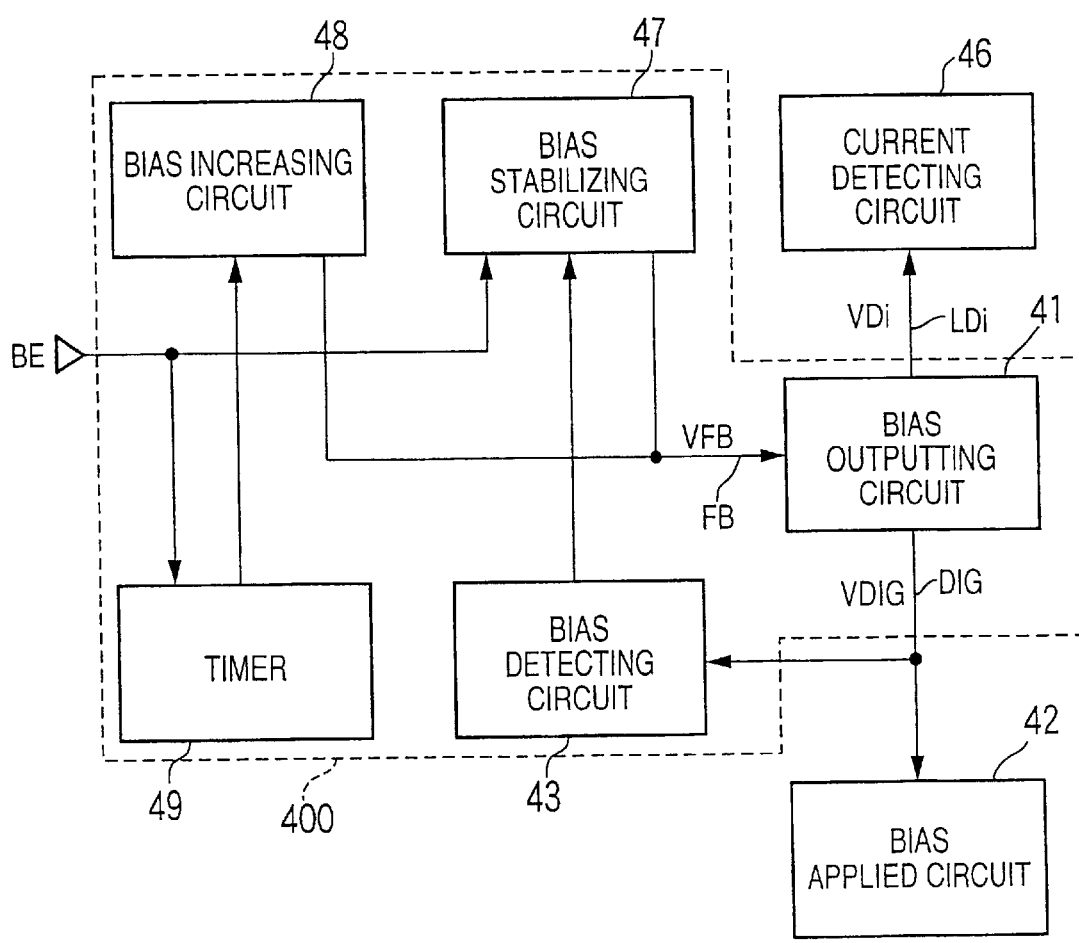
FIG. 4 is a circuit diagram showing the biasing circuit according to a second embodiment of the present invention.

FIG. 4 is a block diagram of the semiconductor memory device with the biasing circuit 401 according to the second embodiment of the present invention. The biasing circuit 401 in the second embodiment is composed of a bias outputting circuit 41, a bias detecting circuit 43, a bias stabilizing circuit 47, a bias increasing circuit 48 and a timer 49.

Also, the voltages outputted through the signal lines $LD_i$, DIG and FB are referred to as a detection voltage $VD_i$, a bias voltage VDIG, and a drive voltage VFB, respectively. It should be noted that the bias outputting circuit 41, the bias detecting circuit 43, the bias applied circuit 42 and the load circuit 46 are same as those of the biasing circuit 400 according to the first embodiment of the present invention. Therefore, the detailed description of them will be omitted.

In the biasing circuit 401 according to the second embodiment, a bias enable signal BE is supplied. The bias voltage VDIG is supplied to the bias applied circuit 42 only when bias enable signal BE is in an active state. The timer 49 supplies a start signal to the bias increasing circuit 48 during a predetermined time when the bias enable signal BE is set to the active state.

The bias increasing circuit 48 outputs the bias drive voltage VFB0 to the bias outputting circuit 41 during a predetermined time after the bias enable signal BE is set to the active state based on a start signal supplied from the timer 49. The bias drive voltage VFB0 functions to increase the output voltage or an output current from the bias outputting circuit 41 more than the stationary state. Therefore, the biasing circuit 401 can start the bias voltage VDIG rapidly to a predetermined voltage.

The bias stabilizing circuit 47 is the same as the bias stabilizing circuit 44 in the first embodiment of the present invention except for the point that the bias stabilizing circuit 47 operates only while the bias enable signal BE is active. It should be noted that the bias increasing circuit 48 may stop the operation when the bias voltage reaches the predetermined voltage or may operate during the period when the timer 49 continues to output the start signal.

In this way, the biasing circuit 401 according in the second embodiment is composed of the bias increasing circuit 48 and the bias stabilizing circuit 47 which are provided as the circuits driving the bias outputting circuit 41. The bias voltage VDIG is rapidly increased by use of the bias increasing circuit 48 during a predetermined period after the bias enable signal BE is set to the active state. Therefore, the biasing circuit 401 according to the second embodiment has the optimal performance and efficiency to the initial bias increasing state and the stationary state. Also, because the influence of disturbance is less in the stationary state and the stable bias voltage VDIG can be supplied to the bias applied circuit 42, the load circuit 46 can detect the current which flows through the bias applied circuit 42 in the stable state.

Figure 5:
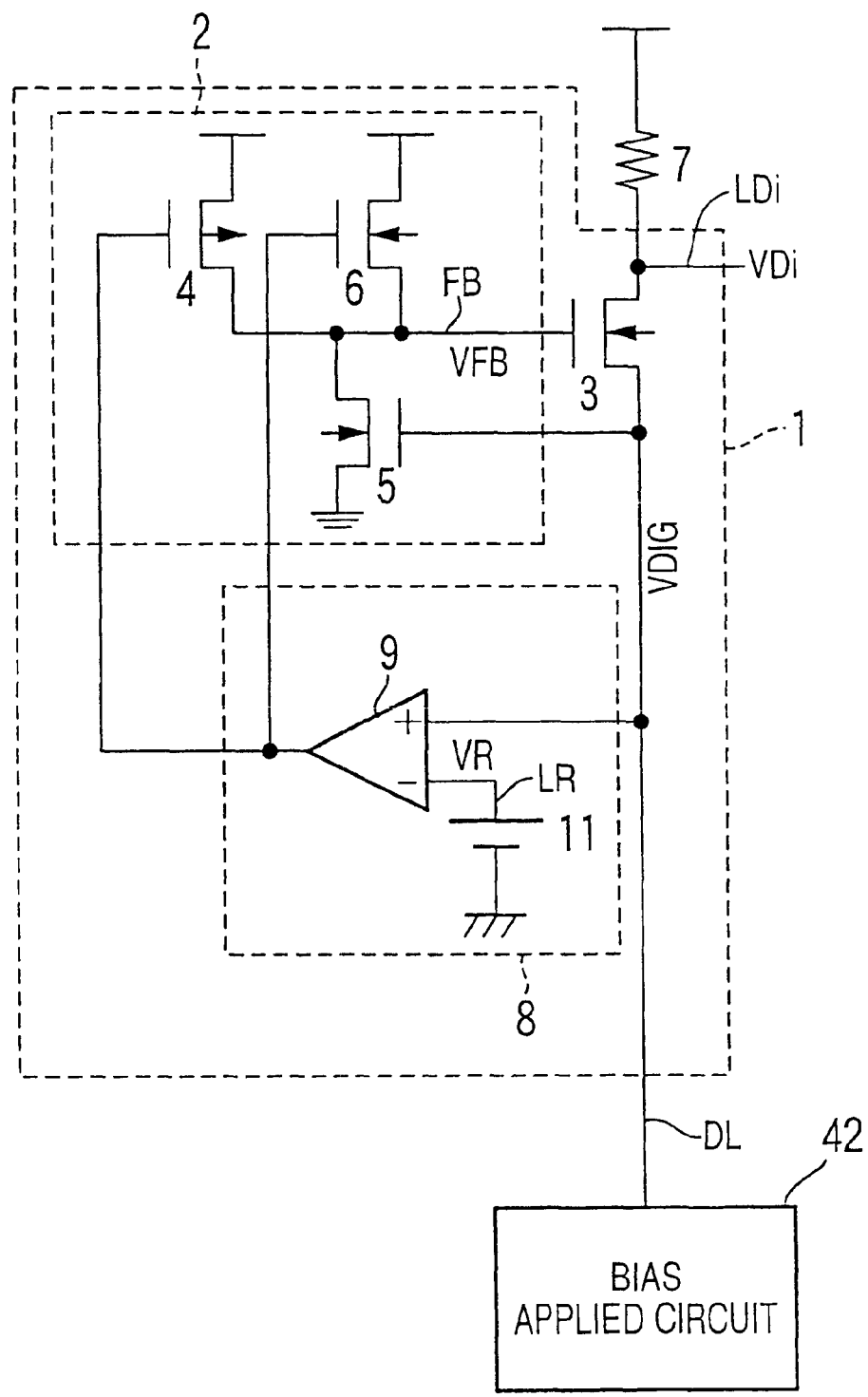
FIG. 5 is a circuit diagram showing the biasing circuit according to a third embodiment of the present invention.

FIG. 5 is a circuit diagram showing the semiconductor memory device with the biasing circuit 1 according to the third embodiment of the present invention. The structure of the biasing circuit 1 in the third embodiment will be described with reference to FIG. 5.

The biasing circuit 1 is connected with the bias applied circuit 42 through the signal line DL and supplies a predetermined bias voltage VDIG to the bias applied circuit 42. A load resistance 7 is used to detect the quantity of current which flows through the bias applied circuit 42 and outputs as a detection voltage $VD_i$, when the predetermined bias voltage VDIG is supplied to the bias applied circuit 42. Here, the detection voltage $VD_i$, the bias voltage VDIG, a drive voltage VFB and a reference voltage VR are the voltages outputted through the signal lines $LD_i$, DL, FB and LR, respectively.

The biasing circuit 1 is composed of a drive circuit 2, and the N-channel transistor 3 for the bias voltage output, and a comparing circuit 8 for the bias voltage detection. The drive circuit 2 is composed of an N-channel transistor 5 which detects the bias voltage, a bias increasing P-channel transistor 4 as the load of the transistor 5, and a bias stabilizing N-channel transistor 6 as the load of the transistor 5.

The source of the P-channel transistor 4 is connected with the side of the power supply voltage, the gate thereof is connected with the output of the comparing circuit 8, and the drain thereof is connected with the gate of the N-channel transistor 3. The drain of the N-channel transistor 6 is connected with the side of the power supply voltage, the gate thereof is connected with the output of the comparing circuit 8 and the source thereof is connected with the gate of the transistor 3. Also, the source of the N-channel transistor 5 is connected to the ground potential, the gate thereof is connected with the drain of the transistor 3 and the drain thereof is connected with the gate of the N-channel transistor 3. Also, the drain of the N-channel transistor 3 is connected with the load resistance 7 and the source thereof is connected with the bias applied circuit 42 through the signal line DL.

The comparing circuit 8 is composed of an operational amplifier 9 and a comparison voltage 11 and compares the bias voltage VDIG and the reference voltage VR of the comparison voltage 11. The operational amplifier 9 outputs the low level when the bias voltage VDIG is lower than the reference voltage VR, and outputs the high level when the bias voltage VDIG is higher than the reference voltage VR.

As described above, the comparing circuit 8 outputs the low level when the bias voltage VDIG is lower than the predetermined voltage VR. Therefore, the P-channel transistor 4 is set to the conductive state so that the drive voltage VFB is outputted from the drain of the P-channel transistor 4 to the gate of the transistor 3. Because the voltage drops is small in the P-channel transistor, the P-channel transistor 4 outputs the drive voltage VFB until the drive voltage VFB is increased to about the power supply voltage (Vcc). For this reason, the N-channel transistor 3 can enhance or increase the drive ability to the bias applied circuit 42 and can increase the bias voltage VDIG rapidly to the predetermined voltage.

Because the comparing circuit 8 outputs the high level when the bias voltage VDIG reaches the predetermined voltage VR, the P-channel transistor 4 is set to the off state or the non-conductive state. Oppositely, the N-channel transistor 6 is set to the conductive state and the drive voltage VFB is outputted from the source of the N-channel transistor 6 to the gate of the N-channel transistor 3. At this time, the impedance of the N-channel transistor 6 is smaller than that of the P-channel transistor 4 in the off state. Therefore, even if the bias voltage VDIG receives disturbance for some reason so as to be changed, the change of the drive voltage VFB in the drain of the N-channel transistor 5 is small. Therefore, there is no case that the biasing circuit oscillates due to the disturbance, and it does not take a long time until the influence of the disturbance is settled. As a result, the load resistance 7 can be used to detect the quantity of current which flows through the bias applied circuit 42 in a short time, and can generate the stable detection voltage $VD_i$ with less influence of the disturbance. Also, the P-channel transistor 4 is made large in size with no relation to the size of the N-channel transistor 6. Therefore, the degrees of freedom of the design can be increased and it is possible to make the drive ability of the N-channel transistor 3 large.

Figure 6:
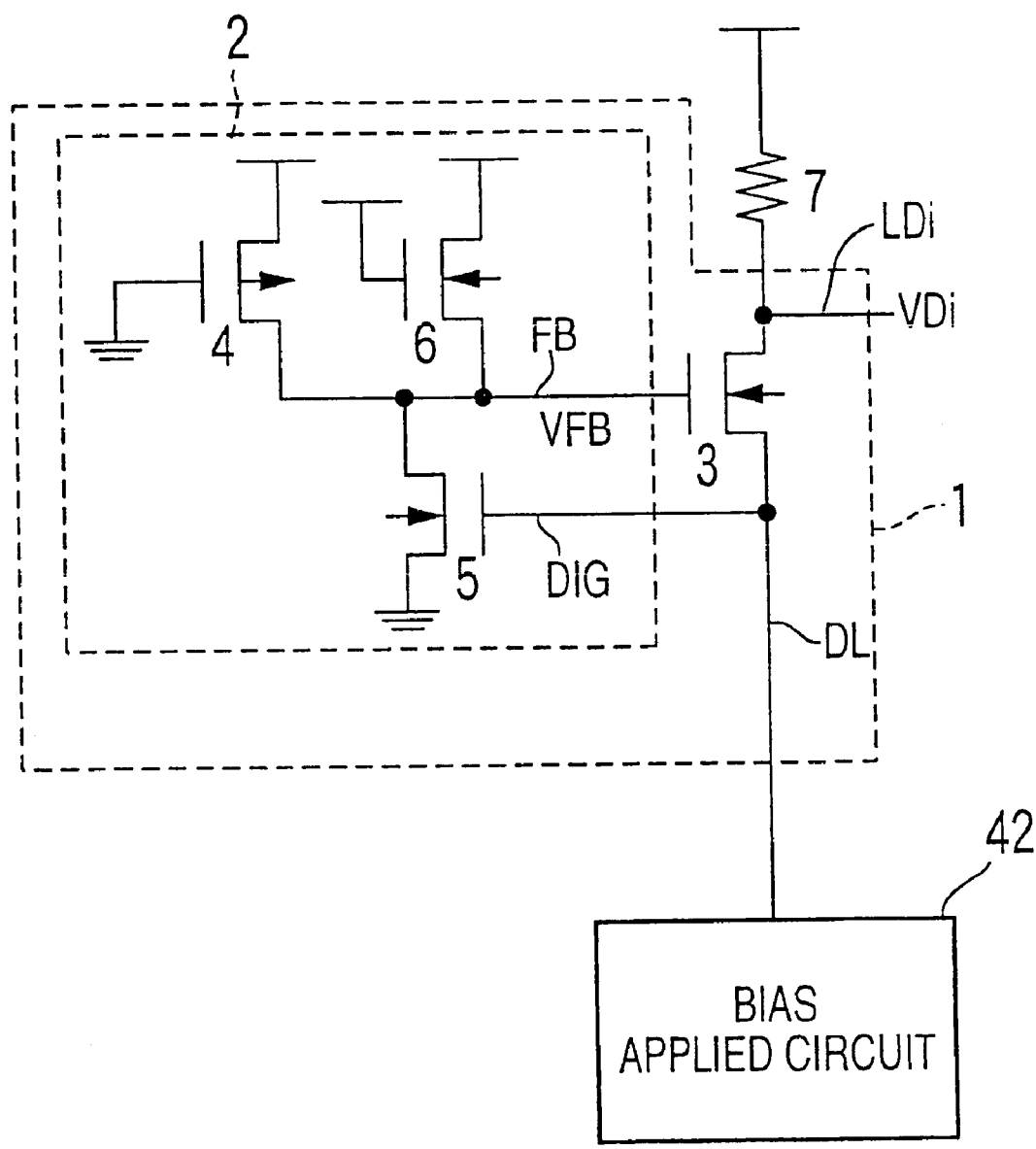
FIG. 6 is a circuit diagram showing the biasing circuit according to a fourth embodiment of the present invention.
Figure 7:
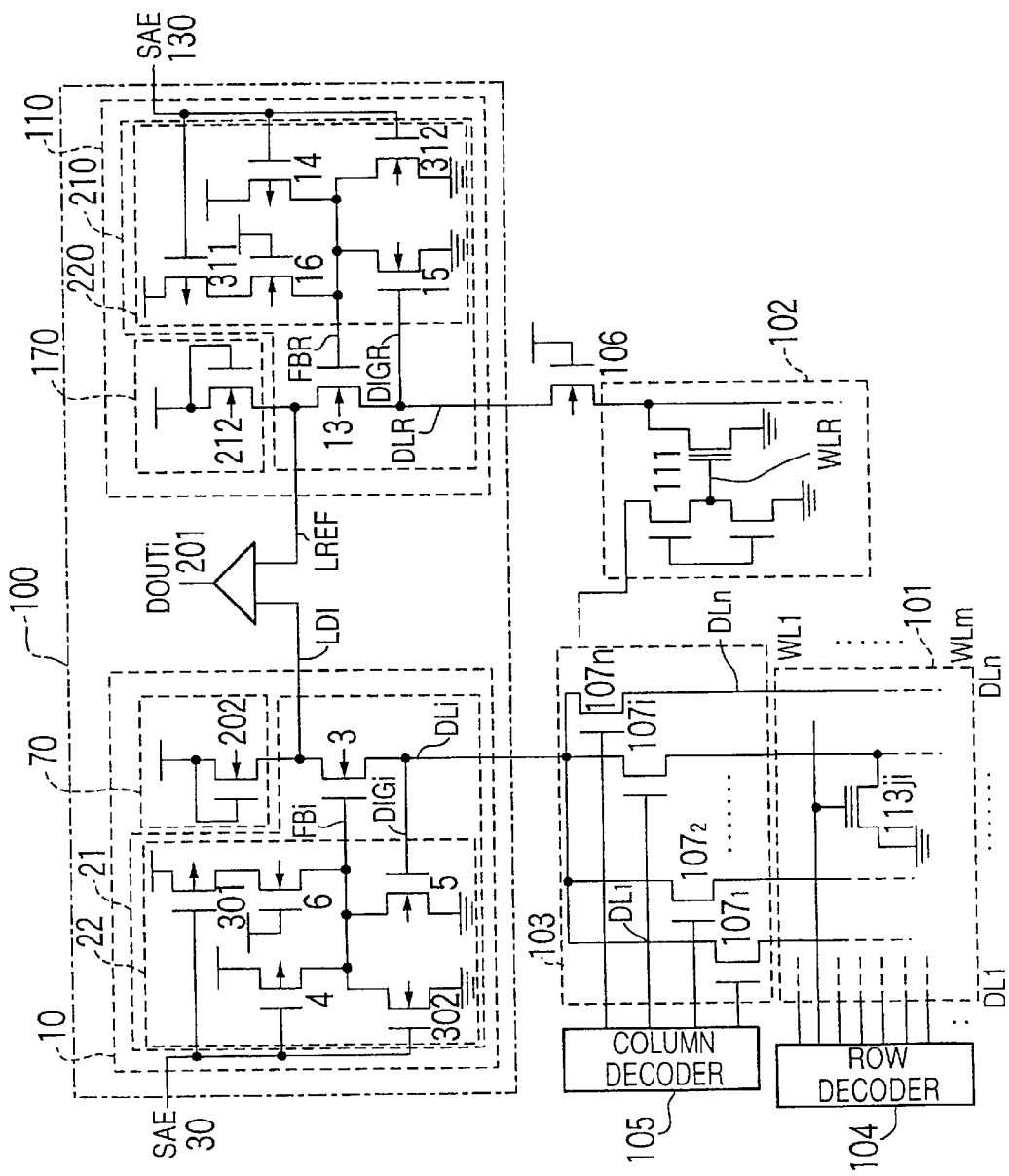
FIG. 7 is a circuit diagram showing a semiconductor memory device containing the biasing circuit according to the fifth embodiment of the present invention.

FIG. 6 is a circuit diagram showing the semiconductor memory device with the biasing circuit 1 according to the fourth embodiment of the present invention. FIG. 7 is a circuit diagram showing a sense amplifier circuit 100 of the semiconductor memory device with a biasing circuit 21 which is a modification of the biasing circuit 1 according to the fifth embodiment of the present invention.

Figure 1:
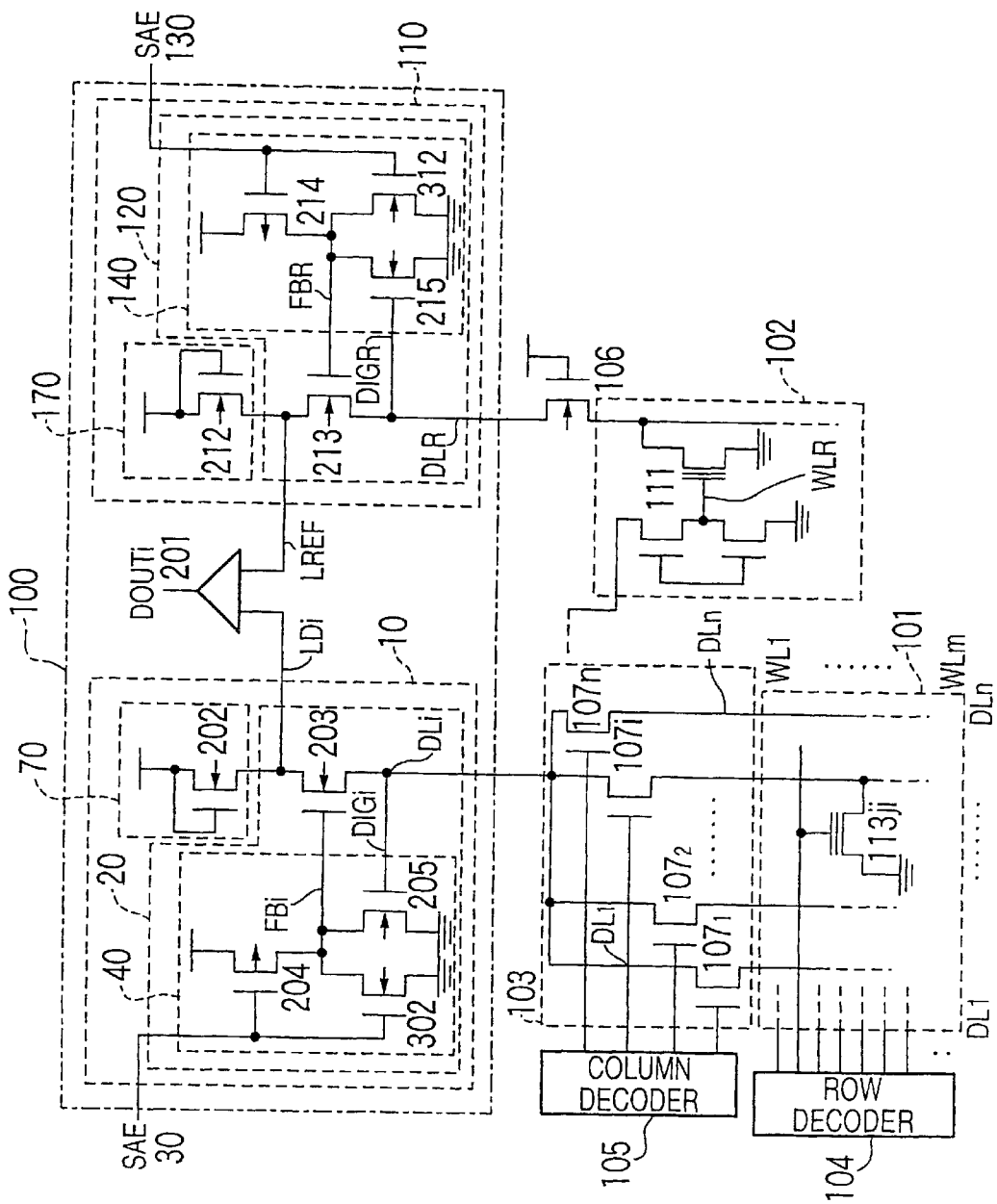
FIG. 1 is a circuit diagram showing a structure example of a sense amplifier circuit provided in a first conventional semiconductor memory device.
Figure 2:
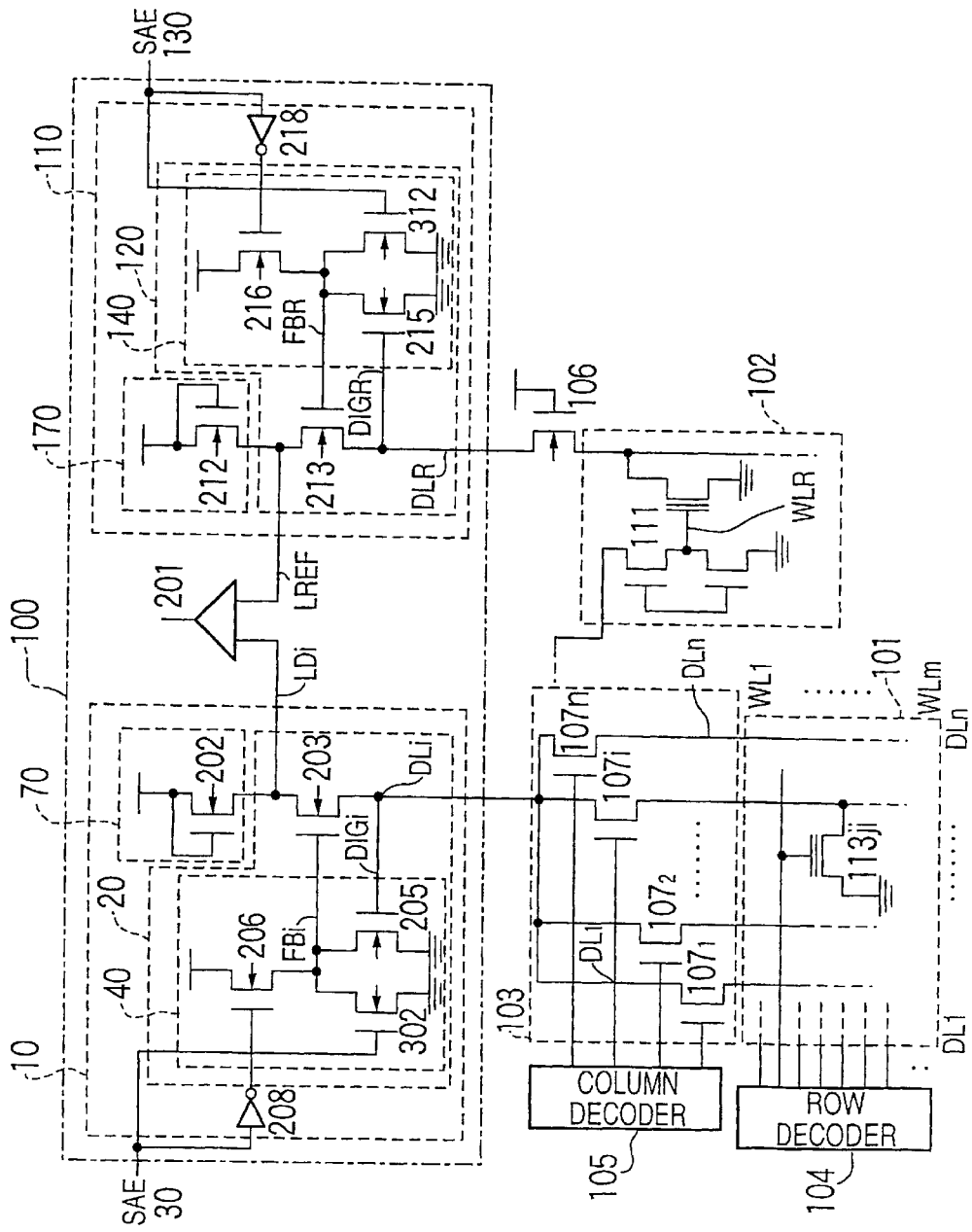
FIG. 2 is a circuit diagram showing another structure example of a sense amplifier circuit provided in a second conventional semiconductor memory device.
Figure 8:
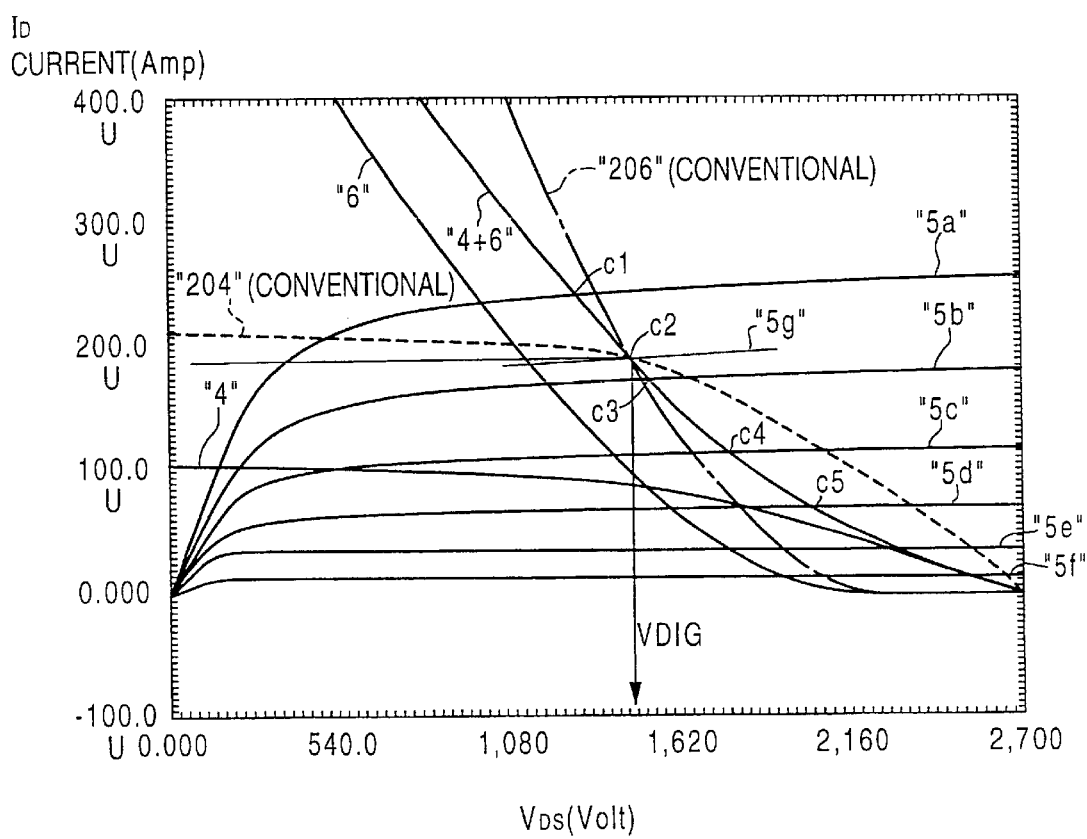
FIG. 8 is a diagram showing the characteristics of the biasing circuit in the fifth this embodiment, and the characteristics of the circuits used in the first and second conventional semiconductor memory devices.
Figure 9:
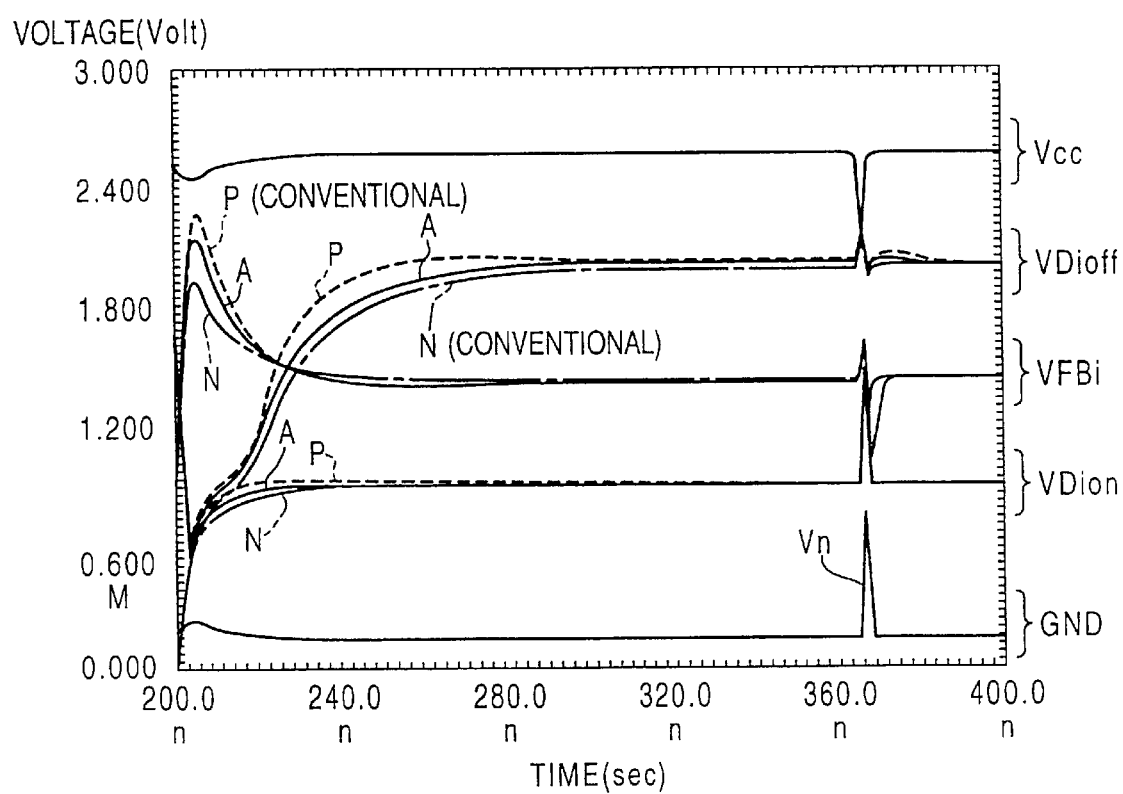
FIG. 9 is a diagram showing the time change of detection voltages $VD_{ion}$ and $VD_{ioff}$ in the biasing circuit in the fifth embodiment and of detection voltages in the first and second conventional semiconductor memory devices, and a drive voltage $VFB_i$.
Figure 10:
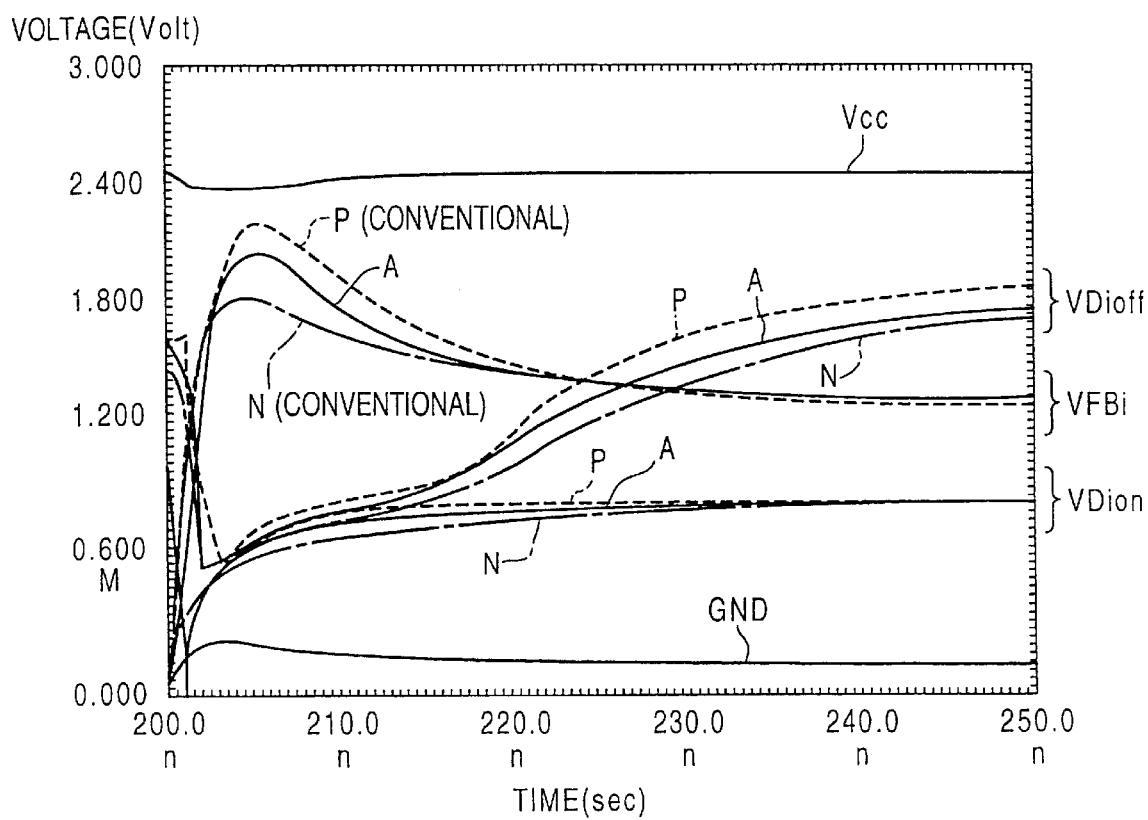
FIG. 10 is an expanded view of FIG. 9 in a range of 200 ns to 250 ns.
Figure 11:
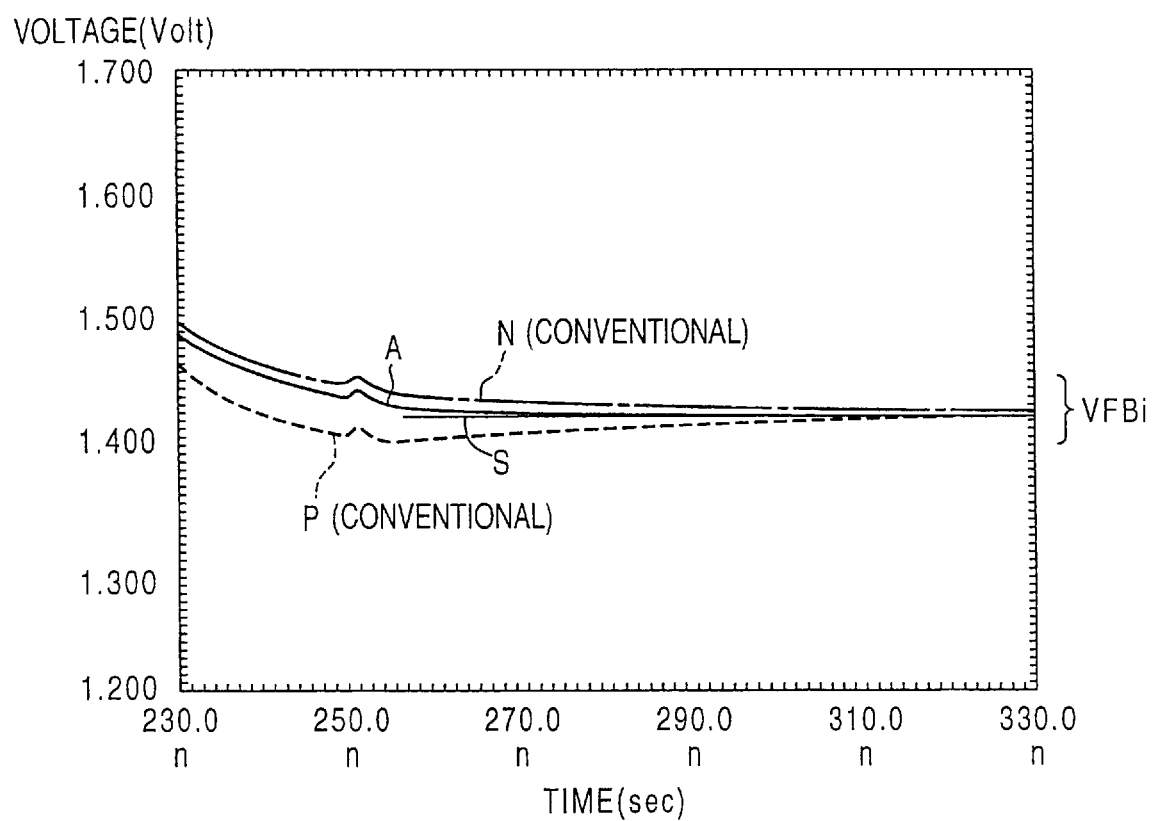
FIG. 11 is an expanded view of FIG. 9 in a range of 230 ns to 330 ns.
Figure 12:
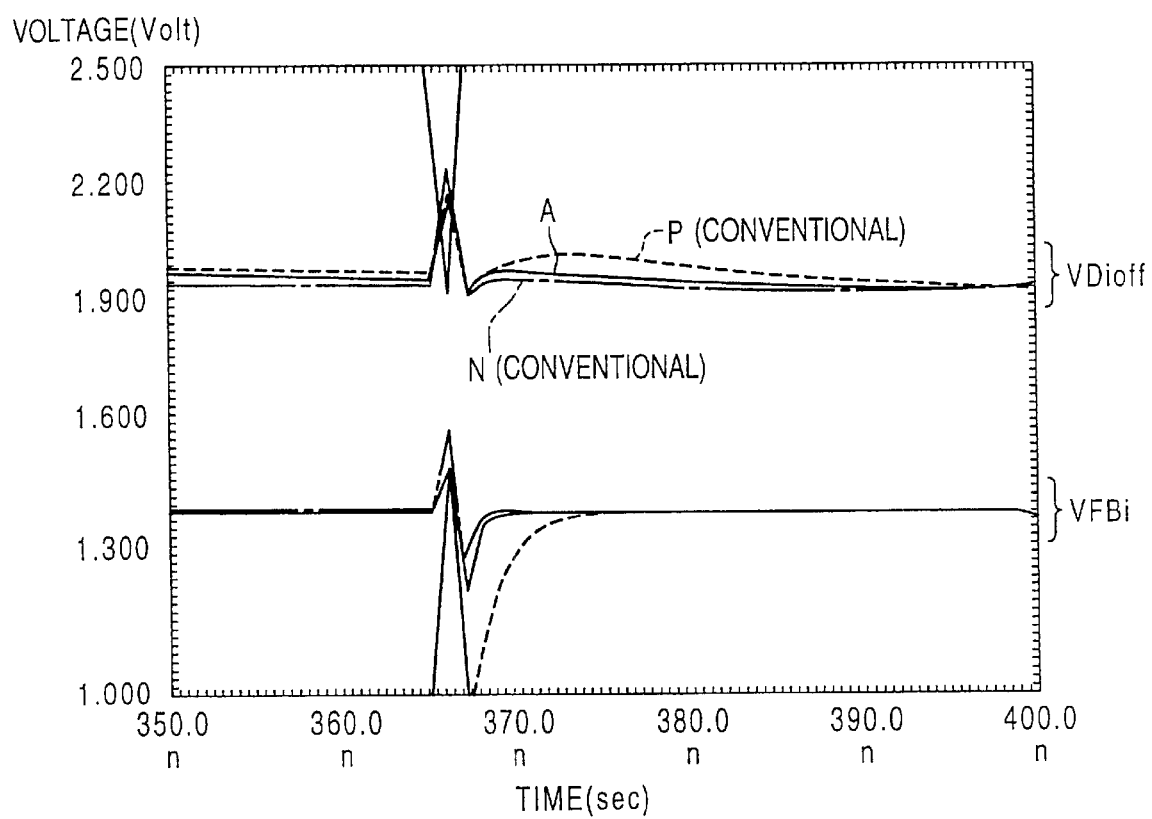
FIG. 12 is an expanded view of FIG. 9 in a range of 350 ns to 400 ns.

FIG. 8 is a characteristic diagram of the biasing circuit 1 shown in FIG. 6 and the characteristics of the biasing circuits 20 in the sense amplifier circuits 100 of the conventional semiconductor memory devices shown in FIG. 1 and FIG. 2. FIG. 9 is a diagram showing time changes of the voltages $VD_{ion}$ and $VD_{ioff}$ and drive voltage $VFB_i$ from the start of the precharging process in the biasing circuit 21 shown in FIG. 7, in the biasing circuit 20 shown in FIG. 1 and the biasing circuit 20 shown in FIG. 2. FIGS. 10 to 12 are partially expanded diagrams of portions around 200 ns tp 250 ns, 230 ns to 330 ns and 350 ns to 400 ns in FIG. 9, respectively.

The structure of the semiconductor memory device of the biasing circuit 1 according to the fourth embodiment of the present invention will be described with reference to FIG. 6.

The biasing circuit 1 is connected with the signal line DL and is composed of a drive circuit 2 and an N-channel transistor 3. The biasing circuit 1 outputs a first predetermined voltage to the signal line DL. That is, the biasing circuit 1 sets the signal line DL to the first predetermined voltage. The drive circuit 2 is composed of a P-channel transistor 4 and an N-channel transistor 6 as a pair of loads and an N-channel transistor 5, and holds the signal line DL to the first predetermined voltage. The P-channel transistor 4 and the N-channel transistor 6 are connected in parallel. Also, the source of the P-channel transistor 4 is connected with the power supply voltage and the drain thereof is connected with the drain of the N-channel transistor 6. The source of the N-channel transistor 5 and the gate of the P-channel transistor 4 are connected to the ground potential and the gate of the N-channel transistor 6 and the drain thereof are connected with the power supply voltage. Also, the drain of the N-channel transistor 3 is connected with a load resistance 7, and outputs to the signal line LD, the voltage $VD_i$ which is proportional to the current flowing through the signal line DL.

Next, an operation of the biasing circuit 1 in the fourth embodiment will be described below. Here, it is supposed that the voltage on the signal line DL of the biasing circuit 1 is near the ground potential.

The P-channel transistor 4 and the N-channel transistor 6 are in the state which always flow the predetermined quantities of current. Moreover, the P-channel transistor 4 has a constant voltage between the source and the gate regardless of the voltage on the signal line FB. Because the voltage difference between the source and the gate is as large as power supply voltage Vcc, the P-channel transistor 4 charges the gate of the N-channel transistor 3 rapidly to a second predetermined voltage. Here, the upper limit of the output voltage of the N-channel transistor 3 is approximately as much as power supply voltage Vcc. Thus, the N-channel transistor 3 can flow a large quantity of charging current on the signal line DL. Therefore, the source voltage of the P-channel transistor 4, i.e., the voltage of the signal line DL can be precharged at high speed to the voltage VDIG which is lower than the voltage on the signal line FB by the threshold voltage VTN of the N-channel transistor 3.

Subsequently, when the voltage on the signal line DL is set to higher than the predetermined voltage, the drain current flowing through the N-channel transistor 3 is increased in the biasing circuit 1. As a result, the drain voltage FB of the N-channel transistor 5 is decreased. Also, the voltage outputted from the N-channel transistor 3 is made low. Oppositely, when the voltage on the signal line DL is lower than the first predetermined voltage, the drain current flowing through the N-channel transistor 3 is decreased. The drain voltage FB of the N-channel transistor 5 is increased in the biasing circuit 3 and the voltage outputted from the N-channel transistor 3 is also increased. As a result, the output voltage of the biasing circuit 1 converges to the predetermined voltage.

The above mentioned operation is repeated in the biasing circuit 1 so that the output voltage FB of the drive circuit 2 is held to a second predetermined voltage. Therefore, the voltage on the signal line DL is pulled up from the neighbor of the ground potential to the first predetermined voltage by the biasing circuit 1 and then is held to the first predetermined voltage $VD_i$.

In the biasing circuit 1, because the P-channel transistor 4 operates as a gate grounded type amplifying circuit, the change of the drain voltage VFB is large to a small change of the drain current. For this reason, in the biasing circuit 1 according to the fourth embodiment, the P-channel transistor 4 and the N-channel transistor 6 in the drive circuit 2 are connected with the power supply voltage in parallel. In addition, the current from the P-channel transistor 4 is designed to be dominant while the output voltage of the biasing circuit 1 is near the ground potential. Therefore, because the drain voltage of the P-channel transistor 4 can be brought close to the power supply voltage, the gate voltage of the N-channel transistor 3 is increased to the high level. As a result, the precharging process can be carried out at high speed to increase the output voltage of the biasing circuit 1 from the ground voltage level to the first predetermined voltage. Also, because the N-channel transistor 6 is generally small in the load resistance, the output amplitude of the biasing circuit 1 is small to the small change of the current. Therefore, in the biasing circuit 1 according to the fourth embodiment, the P-channel transistor 4 and the N-channel transistor 6 in the drive circuit 2 are connected with the power supply voltage in parallel. When the output voltage of the biasing circuit 1 is near the stationary state, an current is mainly outputted from the N-channel transistor 6. Thus, the output voltage of the biasing circuit 1 is pulled up to the first predetermined voltage and can be held in the stable state.

Also, it is supposed that the quantities of current flowing are IP0 and IN0, when the gate of the P-channel transistor 4 and the gate of the N-channel transistor 6 are connected with the ground potential and the power supply voltage, respectively, and when a predetermined drain voltage, e.g., 1.5 V is applied. The sizes of the transistors 4 and 6 are selected to be possible to execute the above-mentioned operation, and a ratio of IP0:IN0 is set in a range of 1:3 to 1:5. In this case, when the output voltage of the biasing circuit 1 is near the ground potential, the current flowing from the P-channel transistor 4 can be set to be dominant. Also, when the output voltage of the biasing circuit 1 is stable near the first predetermined voltage, the characteristic ratio of the P-channel transistor 4 and the N-channel transistor 6 is set as described above. At this time, the current can be automatically switched and continuously supplied based on the voltage of the biasing circuit 1 without an external switching signal such that the current flowing from the N-channel transistor 6 is dominant rather than the current flowing from the P-channel transistor 4. Therefore, it is possible to effectively increase the output voltage from the biasing circuit 1 and also to stabilize the output voltage after reaching the first predetermined voltage.

Next, the operation of the biasing circuit 1 shown in FIG. 6 will be described with reference to FIG. 8, compared with the conventional examples shown in FIG. 1 and FIG. 2.

In FIG. 8, curves "4", "5" and "6" indicate relations between the voltage VDS between the drain and the source and the drain current ID. when the P-channel transistor 4, the N-channel transistor 5, and the N-channel transistor 6 in the biasing circuit 1 shown in FIG. 6 are individually measured. Also, "4+6" is the curve indicating a relation between the voltage VDS between the drain and the source and the drain current ID when the P-channel transistor 4 and N channel transistor 6 are connected in parallel. Also, curves "5" indicate relation between the voltage VDS between the drain and the source and the drain current ID when voltage VGS applied to the gate of the N-channel transistor is changed.

Moreover, the curves indicating a relation between the voltage VDS between the drain and the source and the drain current ID in the P-channel transistor 204 of the biasing circuit 20 provided in the first conventional semiconductor memory device shown in FIG. 1 and the N-channel transistor 206 of the biasing circuit 20 provided in the second conventional semiconductor memory device in shown in FIG. 2 are also shown in FIG. 8 as "204" and "206", respectively. It should be noted that the characteristic of the N-channel transistor 205 in the conventional examples are the same as curve "5".

The curves "6" and "206" are obtained when the voltage of 2.7 V is applied to the drains and gates of the N-channel transistors 6 and 206 and the source voltage VDS is changed in a range of 0 to 2.7 V. The drain current ID increases in these the N-channel transistors 6 and 206 as the voltage difference VDS between the drain and the source is decreased from 2.7 V. This is equivalent to the diode characteristic.

The curve "5" indicates the measuring result the drain current ID flowing when a constant voltage VGS is applied to the gate of the N-channel transistor 5, the source is grounded and the voltage VDS of the drain is changed in a range of 0 to 2.7 V. FIG. 8 shows the curves when the gate voltage VGS is changed into various values. Generally, it would be understood that the transistor shows a constant current characteristic and the drain current ID changes scarcely even if the voltage difference VDS between the drain and the source changes, when the gate voltage VGS is constant. Also, as the gate voltage VGS increased to a high level, the drain current ID increases.

The curves "4" and "204" shows the measuring result of the drain current ID flowing when the gate of the P-channel transistor 4 is connected to the ground potential, 2.7 V is applied to the source and the drain voltage VDS is changed in a range of 0 to 2.7 V. The drain current ID increases as the drain voltage VDS decreases. However, because the gate voltage VGS is constant (0V), the P-channel transistors 4 and 204 show constant current characteristics. It would be understood that even if the voltage difference VDS between the drain and the source changes, the drain current ID changes scarcely. It should be noted that the reason why the difference in the drain current ID is between the curves "4" and "204" is that the transistors are different from each other in sizes and in the current drive ability.

The curve "4+6" indicates the measuring result of the drain currents ID flowing through the two transistors 4 and 6 when the voltage of 2.7 V is applied to the source of the P-channel transistor 4, and the drain and gate of the N-channel transistor 6, the gate of the P-channel transistor 4 is grounded and the drain voltage VDS of the P-channel transistor 4 and the source of the N-channel transistor 6 are changed in a range of 0 to 2.7 V. The curve is equivalent to the addition of the drain currents (the curves "4" and "6") which respectively flow through the P-channel transistor 4 and the N-channel transistor 6. Like the transistors 6 and 206, in these transistors 4 and 6, as the source voltage is decreased from 2.7 V, i.e., as the voltage difference VDS between the drain and the source increases, the drain current ID increases. However, the drain current ID does not start to flow in the curves "6" and "206" until the voltage VDS between the drain and the source is set to equal to or less than 2.2 V. On the other hand, the drain current ID starts to flow. in the curve "4+6" immediately when the voltage VDS is set to equal to or less than 2.7 V. This is due to the following reason. That is, in the P-channel transistor 4, the voltage VGS between the gate and the source is 2.7 V even when the voltage VDS is 2.7 V and the voltage difference between the drain and the source is 0 V. Therefore, the current starts to flow immediately after the source voltage becomes smaller than 2.7 V. On the other hand, the N-channel transistors 6 and 206 have threshold voltages VTN. Therefore, if the gate voltage is not higher by VTN than the source voltage, in other words, the voltage difference between the drain and the source does not become larger than VTN, the drain current ID does not start to flow. For such a reason, the difference has present between the curve "4+6" and "6" or "206".

Next, an operation of the drive circuit 2 shown in FIG. 6 will be described with reference to FIG. 8.

The N-channel transistor 5 operates as the source grounded type amplifier, and amplifies the input voltage VDGI on the signal line DIG which is supplied to the gate, to output the voltage generated in the load transistors 4 and 6 as the drive voltage VFB. At this time, the curve "5" shows the input-output characteristics of the N-channel transistor 5 and the curve "4+6" shows the load curve of the transistor 5.

Now, it is supposed that the gate voltage of the N-channel transistor 5 is about 2 V on the curve "5a", the drain voltage of the N-channel transistor 5 is set to the voltage of about 1.3 V at the point of intersection C1 of the curves "5a" and "4+6", because the drain current ID flowing through the N-channel transistor 5 has the same values of about 230 μA as the drain currents ID flowing through the transistors 4+6. Similarly, when the gate voltage is one the curves "5b", "5c", and "5d", the drain voltages of the N-channel transistor 5 are set to the voltages at points of intersections C3, C4 and C5, respectively. Also, when the gate voltage is about 1.5 V on the curve "5g", the drain current ID of about 200 μA flows so that the drain voltage of the N-channel transistor 5 is set to the voltage of about 1.5 V at the point of intersection C2 of the curves "5g" and "4+6".

In this case, if the threshold voltage VTN of the N-channel transistor 3 is 0 V, the drive voltage VFB, which is equal to the drain voltage of the N-channel transistor 5, is fed back to the gate of the N-channel transistor 5 as an input voltage VDGI through the N-channel transistor 3. For example, when the gate voltage is on the curve "5a", the drain voltage is set to a voltage at point of intersection C1. This voltage is fed back to the gate of the transistor 5 through the N-channel transistor 3. If this voltage is lower than the gate voltage and is equivalent to the curve "5c", the drain voltage of the transistor 5 moves to the point of intersection C4 to increase the drain voltage of the transistor 5. Similarly, if this voltage is fed back to the gate of the N-channel transistor 5 through the N-channel transistor 3 and this voltage is higher than the gate voltage and is equivalent to the curve "5g", the drain voltage of the N-channel transistor 5 moves to the point of intersection C2 to decrease the drain voltage of the N-channel transistor 5. At this time, because the drain voltage and the gate voltage in the N-channel transistor 5 are the same voltage of about 1.5 V, the biasing circuit 1 is settled to the operation point C2.

It is supposed that the biasing circuit 1 is in the stationary state and operates at the point of intersection C2, and the current flowing through the signal line DL changes for some reason. In the first conventional example shown in FIG. 1, the output voltage VDIG changes along the curve "204" in the drain voltage of the N-channel transistor 205 and moreover there is little drain voltage dependence upon the drain current on the curve "204". Therefore, the output voltage VDS changes greatly, even if the drain current ID changes a little.

On the other hand, in the second conventional example shown in FIG. 2, because the output voltage VDIG is changed along the curve "206" in the drain voltage of the N-channel transistor 205, and moreover the curve "206" is increased rapidly on FIG. 8, a small change of the output voltage VDS occur., even if the drain current ID changes a little. In this embodiment, the output change to the load change and to foreign noise show the middle characteristic of the two conventional examples.

Also, when power supply voltage Vcc is not increased sufficiently immediately after the biasing circuit 1 stats the operation, a small voltage differences between the drain and the source of about 2.7 V of FIG. 8 is produced. In this state, in the first conventional example shown in FIG. 1, when the small voltage difference is produced, the drain current ID starts to flow, as shown in the curve "204" of FIG. 8. On the other hand, in the second conventional example shown in FIG. 2, unless the voltage difference between the drain and the source is more than threshold voltage VTN as shown in the curve "206" in FIG. 8, the drain current ID does not start to flow. Therefore, in the second conventional example of FIG. 2, the voltage increasing operation of the signal line DL becomes late. It would be understood that the characteristic of the voltage increasing operation on the signal line in this embodiment has a middle characteristic of the two conventional examples.

Next, FIG. 7 shows the sense amplifier circuit 100 in the semiconductor memory device with the biasing circuit 21 according to the fifth embodiment. As shown in FIG. 7, the semiconductor memory device is a nonvolatile memory device which uses a floating gate type MOSFET as a memory cell. The semiconductor memory device is composed of a memory cell array 101 for data storage and the sense amplifier circuit 100 which reads the data from the memory cell array 101 by increasing the digit line $DL_i$ in voltage from the ground potential GND to a predetermined voltage VDIG. The sense amplifier circuit 100 is composed of a sense circuit 10, a reference circuit 110, a data detecting circuit 201. The biasing circuit 21 containing the components of the biasing circuit 1 shown in FIG. 6 is provided in the sense circuit 10. The drain of the N-channel transistor 6 is connected to the power supply voltage via a P-channel transistor. A signal SAE 30 is supplied to the gate of the P-channel transistor 4 and the gate of the P-channel transistor connected with the N-channel transistor 6. Also, an N-channel transistor 302 is connected in parallel to the N-channel transistor 5 and the gate of transistor 302 is supplied with the signal SAE 30.

In the sense amplifier circuit 100, the sense circuit 10 and the data detecting circuit 201, and the reference circuit 110 and the data detecting circuit 201 are connected through the signal lines $LD_i$ and LREF, respectively. The data detecting circuit 201 compares the detection voltage $VD_i$ outputted from the sense circuit 10 and the reference voltage VREF outputted from the reference circuit 110. Then, the data detecting circuit 201 reads the data of the memory cell $113_{ji}$ (j=1 to m, i=1 to n) from the memory cell array 101 to output the read data through an output buffer (not shown).

It should be noted that a case will be described where the word line $WL_j$ and the digit line $DL_i$ are selected to read the stored data in the memory cell $113_{ji}$ and the voltage of the digit line $DL_i$ is increased to the voltage VDIG. Also, the structure and operation of the semiconductor memory device shown in FIG. 7, which includes the memory cell array 101, a reference cell array 102, a column selector 103, other than the sense amplifier circuit 100 are substantially the same as those of the semiconductor memory devices shown in FIG. 1 and FIG. 2. Therefore, the description of them will be omitted.

The biasing circuit 21 has the structure of the biasing circuit 1 shown in FIG. 6. That is, the biasing circuit 21 is composed of one pair of transistors such as the P-channel transistor 4 and N-channel transistor 6, the drive circuit 22 containing the N-channel transistor 5 and the N-channel ;transistor 3. It should be noted that in the biasing circuit 21 according to this embodiment, it is supposed that output voltages on the signal lines $FB_i$, $DIG_i$ and $LD_i$ are the drive voltage $VFB_i$, the voltage $VDIG_i$, and the voltage $VD_i$, respectively. Also, a case will be described where the voltage of the digit line $DL_i$ is increased to the voltage VDIG.

The sense circuit 10 is composed of a biasing circuit 21 for supplying the digit line $DL_i$ with the predetermined voltage and a load section 70 for generating the detection voltage $VD_i$. The sense circuit 10 is activated in response to the sense amplifier operation enable signal (SAE) 30. The biasing circuit 21 supplies the digit line $DL_i$ with the predetermined voltage and the load section 70 generates the detection voltage $VD_i$ based on the current from a selected memory cell $113_{ji}$.

The biasing circuit 21 is composed of the drive circuit 22 and the N-channel transistor 3. The drive circuit 22 is composed of one pair of P-channel transistor 4 and N-channel transistor 6 which are connected in parallel, and the N-channel transistor 6, the P-channel transistor 301 and the N-channel transistor 302. The source of the P-channel transistor 4 is connected with the power supply voltage and the drain thereof is connected with the drain of the N-channel transistor 5, and the source of the N-channel transistor 6 and the drain of the N-channel transistor 302. The source of the N-channel transistor 5 and the source of the N-channel transistor 302 are connected with the ground potential. Also, the drain of the N-channel transistor 6 is connected with the drain of the P-channel transistor 301, the source of the P-channel transistor 301 is connected with the power supply voltage and the gate thereof is supplied with the sense amplifier operation enable signal (SAE) 30.

The signal SAE 30 is supplied to the gates of the P-channel transistor 4 and P-channel transistor 301. The signal SAE 30 permits the biasing circuit 21 to supply the digit line $DL_i$ with the bias voltage when the signal SAE is the low level. Also, the signal SAE prohibits operation of the biasing circuit 21 when the signal SAE is the high level so that the supply of the bias voltage to the digit line $DL_i$ is stopped.

Also, the load section 70 is composed of the N-channel transistor 202. Because the drain and gate of the N-channel transistor 202 are connected with the side of the power supply voltage, the N-channel transistor 202 is in the state which the current can be always flowed. The drive voltage $VFB_i$ as an output from the drive circuit 22 is supplied to the gate of the N-channel transistor 3 such that the voltage VDIG is outputted from the drain of the N-channel transistor 3 onto the digit line $DL_i$.

On the other hand, the reference circuit 110 is the circuit which supplies the reference digit line DLR with the predetermined voltage and generates the reference voltage VREF. The reference circuit 110 is composed of a reference biasing circuit 210 for supplying the reference digit line DLR with the predetermined voltage and a load section 170 for generating the reference voltage VREF. The reference biasing circuit 210 and the load section 170 have the similar structures to the biasing circuit 21 and the load section 70 which are provided in the sense circuit 10.

The reference biasing circuit 210 is composed of a reference drive circuit 220 and an N-channel transistor 13. The drive circuit 220 is composed of a pair of transistors such as an N-channel transistor 16 and a P-channel transistor 14 and an N-channel transistor 15. The load section 170 is composed of an N-channel transistor 212. A transistor having the size larger than the N-channel transistor 202 in the sense circuit 10 is used as the N-channel transistor 212. Thus, because the load section 170 has a resistance smaller than the load section 70, the reference voltage VREF can be set to the middle voltage. The method of setting to the middle voltage is not limited to the method of changing the size of the N-channel transistor 212. For example, when the N-channel transistor 212 and the N-channel transistor 202 have the same size, the electron injection quantity to the reference cell 111 may be adjusted, or the size of the reference cell 111 may be adjusted such that the middle voltage is set.

The data detecting circuit 201 is connected with the sense circuit 10 and the reference circuit 110, and compares the detection voltage $VD_i$ on the signal line $LD_i$ and the reference voltage VREF on the signal line LREF to determine the stored data of a selected memory cell $113_{ji}$. The output buffer (not shown) is connected with the output side of the data detecting circuit 201 to output the stored data to an external device.

As mentioned above, each of the memory cells $113_{11}$ to $113_{mn}$ of the nonvolatile memory device stores a data based on whether or not electrons are injected to the floating gate. In other words, even if the gate or the word line is set to the high level when electrons have been injected to the floating gate, the drain current or the off current is less than a predetermined value. Also, the drain current or the on current is larger than the predetermined value when the electrons have been pulled out.

On the other hand, because electrons of a predetermined quantity are injected into the reference cell 111 of the reference cell array 102, a predetermined quantity of current flows through the load section 170 to produce the reference voltage VREF which is middle voltage. That is, when electrons have been injected to the floating gate of the memory cell $113_{ji}$ and the off current flows through the transistor $113_{ji}$ the data corresponds to "1". Also, when electrons have been pulled out from the floating gate and the on current flows, the data corresponds to "0".

Moreover, as mentioned above, the reference voltage VREF is produced by the N-channel transistor 212 in the load section 170 of the reference circuit 110. The reference voltage VREF is set to the middle value of the voltages which are produced by the N-channel transistor 202 in the load section 70 of the sense circuit 10 by use of the on current and the off current. That is, when the voltage produced based on the current flowing through the reference digit line DLR is the reference voltage VREF. The detection voltage $VD_i$ produced based on the on current or the off current which flows through the digit line $DL_i$ are $VD_{ion}$ and $VD_{ioff}$, respectively. The data detecting circuit 201 determines whether the stored data is "1" or "0" based on whether $VD_i$ on and $VD_{ioff}$ are higher than VREF, and outputs the data which has been read to the output buffer (not shown).

Next, the operation of the sense circuit 10 in the sense amplifier circuit 100 shown in FIG. 5 will be described below in detail.

In the biasing circuit 21 in the sense circuit 10, when the sense amplifier operation enable signal SAE 30 is set to the low level, the P-channel transistor 4 and the P-channel transistor 301 are both turned on and the N-channel transistor 302 is turned off. Accordingly, the voltage on the signal line $FB_i$ is increased. In this case, the P-channel transistor 4 first starts rapidly for above-mentioned reason so that current is mainly supplied from the P-channel transistor 4 to the gate of the N-channel transistor 3. As a result, the N-channel transistor 3 is set to the conductive state. Therefore, the voltage on the signal line $FB_i$ and the voltage of the digit line $DL_i$ are increased. This process is the precharging process.

The bias voltage VDIG as the gate voltage of the N-channel transistor 5 is increased and the drain current of the N-channel transistor 5 is also increased. Therefore, the drive voltage $VFB_i$ on the signal line $FB_i$ starts to be decreased. When the drive voltage $VFB_i$ is decreased so that the bias voltage VDIG is decreased and also the drain current of the N-channel transistor 5 is decreased, the voltage $VFB_i$ is increased. A series of these operations are repeated in the sense circuit 10 such that,the voltage on the signal line $FB_i$ is converged to a predetermined bias voltage VDIG.

The N-channel transistor 6 can flow a predetermined quantity of current because the gate of the N-channel transistor 6 is connected with the power supply voltage. When the drive voltage $VFB_i$ as the source voltage of the N-channel transistor 6 is increased, the voltage to control the gate of the N-channel transistor 3 changes is gradually and continuously changed from the state in which the drain voltage of the P-channel transistor 4 is dominant to the state in which the source voltage of the N-channel transistor 6 is dominant.

That is, the load resistance of the N-channel transistor 5 is switched from the the P-channel transistor 4 of the high resistance load to the N-channel transistor 3 of the low resistance load. Therefore, the control gain of the drive circuit 21 decreases, so that the change in the bias voltage on the digit line $DL_i$ becomes little and is stabilized.

In this way, the voltage of the sense circuit 10 is kept constant by the drive circuit 21. Also, the voltage on the digit line $DL_i$ is kept constant and the detection voltage $VD_i$ is outputted by the data detecting circuit 201. At this time, in the reference biasing circuit 210, the voltage of the reference digit line DLR is increased and the reference voltage VREF is outputted to the data detecting circuit 201. Therefore, the voltage difference between the detection voltage $VD_i$ and the reference voltage VREF is sensed by the data detecting circuit 201 (the sensing process). In this sensing process, it is made possible to carry out a precise sensing operation because the N-channel transistor 6 is provided in the biasing circuit 21 so that the stabilized detection voltage $VD_i$ can be attained.

Also, to allow the above-mentioned operation to be carried out, in the biasing circuit 21 of FIG. 7, the characteristics of the P-channel transistor 4 and the N-channel transistor 6 are set in such a manner that the voltage from the P-channel transistor 4 is dominant, when the the bias voltage VDIG outputted from the biasing circuit 21 is near the ground potential GND, and that the voltage from the N-channel transistor 6 is dominant, when the the bias voltage VDIG outputted from the biasing circuit 21 is stable and is near the predetermined voltage.

In the biasing circuit 21 of the sense circuit 10, when the sense amplifier operation enable signal SAE 30 is set to the high level, the P-channel transistor 4 and the P-channel transistor 301 are both turned off and the N-channel transistor 302 is turned on. Accordingly, the voltage $VFB_i$ on the signal line $FB_i$ is set to about 0 V and the bias voltage VDIG outputted onto the digit line is decreased to about 0 V.

Next, the characteristic of the biasing circuit 21 according to this embodiment provided in the sense amplifier circuit 100 of the semiconductor memory device shown in FIG. 7 and the characteristics of the biasing circuits 20 provided in the sense amplifier circuit 100 of the conventional semiconductor memory devices shown in FIGS. 1 and 2 will be compared and described with reference to FIGS. 10 to 12.

FIG. 10 shows time change of the detection voltages $VD_{ion}$, $VD_{ioff}$, the drive voltage $VFB_i$ in the biasing circuit 20 shown in the biasing circuit 21 shown in FIG. 7, and the biasing circuits 20 shown in FIG. 1 and 2 from the start of the precharging process. The detection voltages $VD_{ion}$ and $VD_{ioff}$ and the drive voltage $VFB_i$ as the voltage values on the signal lines $LD_i$, $FB_i$ and $DIG_i$ of in the biasing circuit 21 shown in FIG. 7 are shown by "A", respectively. The detection voltages $VD_{ion}$ and $VD_{ioff}$ and the drive voltage $VFB_i$ in the biasing circuit 10 shown in FIG. 1 are shown by "P", respectively. Also, the detection voltages $VD_{ion}$ and $VD_{ioff}$ and the drive voltage $VFB_i$ in the biasing circuit 20 shown in FIG. 2 are shown by "N", respectively.

Also, FIG. 9 shows the change of the data detecting circuit 201 and the change of power supply voltage Vcc when noise VN is intentionally applied to the above-mentioned circuits around 370 ns. FIG. 10 to FIG. 12 are expanded views of FIG. 9 around 200 ns to 250 ns, 230 ns to 330 ns, and 350 ns to 400 ns, respectively.

As shown in FIG. 9, when the sense amplifier operation enable signal SAE 30 is set to the low level in the sense amplifier circuit 100 shown in FIG. 7, FIG. 1, and FIG. 2, the precharging process is started to increase the biasing circuits 20 and 21 from the ground potential to the predetermined voltage in the drive circuits 40 and 22. As the elapsing of time, the detection voltages $VD_{ion}$ and $VD_{ioff}$ and the drive voltage $VFB_i$ are stabilized to a constant voltage and are kept constant. The detection voltage $VD_i$ is outputted to the data detecting circuit 201 when voltage is stabilized and the sensing process is carried out. Also, in FIG. 9, noise is intentionally applied around 365 ns so as to confirm noise tolerance. Also, FIG. 9 shows the change of detection voltages $VD_{ion}$ and $VD_{ioff}$ in case of the stored data of "0" and "1".

The characteristic of these the biasing circuits will be described with reference to FIG. 10 in which a portion of FIG. 9 in the neighborhood of 200 ns is expanded.

The drive voltage VFBi, shown in "A", of the biasing circuit 21 of the FIG. 7 according to this embodiment increases quickly following the drive voltage VFBi shown in "P" of the biasing circuit 20 of the FIG. 1. On the other hand, it is the slowest that the drive voltage VFBi shown in "N" of the biasing circuit 20 of the FIG. 2 is increased. On the other hand, the biasing circuit 21 of the FIG. 7 according to this embodiment uses the P-channel transistor 4 on the side of the power supply voltage of the drive circuit 22. Therefore, the voltage of the biasing circuit 21 can be rapidly increased from the ground potential to the predetermined voltage due to the characteristic of the P-channel transistor 4.

The drive voltage $VFB_i$ of the biasing circuit 21 of the FIG. 7 according to this embodiment shown by "A" converges to the predetermined voltage quickly following the drive voltage $VFB_i$ of the biasing circuit 20 of the FIG. 2 shown in "N". On the other hand, the drive voltage $VFB_i$ of the biasing circuit 20 of the FIG. 1 shown in "P" is converged the latest. On the contrary, the biasing circuit 21 of the FIG. 7 according to this embodiment uses the N-channel transistor 6 on the side of the power supply voltage of the drive circuit 22. Therefore, the convergence on the predetermined voltage is quick due to the characteristic of the N-channel transistor 6.

Next, the detection voltages $VD_{ion}$ and $VD_{ioff}$ will be described. Because the transistor 202 is in the ON state and the transistor 203 is in the OFF state at the time when the signal SAE 30 is set to the low level, the detection voltage $VD_i$ is about 1.5 V. However, the transistor 203 is set to the conductive state, so that the detection voltage $VD_i$ is rapidly decreased to about 0.7 V.

When the voltage of the digit line $DL_i$ is settled to the predetermined voltage, the current starts to flow through the memory cell $113_{ji}$ from the time of about 215 ns. Because the on current flows through the memory cell $113_{ji}$ having the stored data of "1", the detection voltage $VD_{ion}$ converges to about 0.9 V. Because the off current flows through the memory cell $113_{ji}$ having the stored data of "0", the detection voltage $VD_{ioff}$ is increased to about 1.8 V.

As shown in the detection voltage $VD_{ioff}$ of FIG. 10, the detection voltage $VD_{ioff}$ of the biasing circuit 21 of the FIG. 7 according to this embodiment shown in "A" is increased faster following the voltage $VD_{ioff}$ of the biasing circuit 20 of the FIG. 1 shown in "P". On the other hand, the voltage $VD_{ioff}$ of the biasing circuit 20 of the FIG. 2 shown in "N" is increased the slowest. Also, although the voltage $VD_{ioff}$ of the biasing circuit 20 of the FIG. 1 shown in "P" is increased rapidly, it takes a long time until the voltage $VD_{ioff}$ of the biasing circuit 20 converges to the predetermined voltage, because there is overshooting in the voltage $VD_{ioff}$ of the biasing circuit 20. On the other hand, the biasing circuit 21 of FIG. 7 according to this embodiment is using the N-channel transistor 6 and the P-channel transistor 4 on the side of the power supply voltage of the drive circuit 22. Therefore, the increasing and the converging of the voltage to the predetermined voltage are faster.

Next, the characteristic of these biasing circuits will be described with reference to FIG. 11 which is a partially expanded view of a range of 230 ns to 330 ns in FIG. 9.

A straight line shown in "S" in FIG. 11 shows the drive voltage $VFB_i$ stabilized in the stationary state. Referring to FIG. 11, it is possible to confirm that the drive voltage $VFB_i$ of the biasing circuit 21 according to this embodiment shown in "A" is stabilized in the nearest state to the straight line shown in "S" with time. On the other hand, it takes a long time for convergence in the second conventional example shown in "N". Also, it takes a long time for convergence in the first conventional example shown in "P", similar to the second conventional example shown in "N". This is because the voltage is converged to the predetermined voltage "S" after the voltage undergoes undershooting.

As shown in the above, it is possible for the biasing circuit 21 according to this embodiment to be stabilized to the voltage faster after the voltage is increased to the predetermined voltage.

Next, the characteristics of these biasing circuits will be described with reference to FIG. 12 which is a partially expanded view of a range of 350 ns to 400 ns in FIG. 9. FIG. 12 shows a partially expanded view of FIG. 9 in the neighborhood of about 365 ns where the detection voltages $VD_{ion}$ and $VD_{ioff}$ and the drive voltage $VFB_i$ are stabilized to the constant voltages, respectively. FIG. 12 shows the change of the detection voltage $VD_i$ after noise is intentionally applied to each of the biasing circuits. As shown in FIG. 12, the detection voltage $VD_i$ of the biasing circuit 21 of the FIG. 7 according to this embodiment shown in "A" is faster stabilized following the detection voltage $VD_i$ of the biasing circuit 20 of the FIG. 2 shown in "N". On the other hand, it would be understood that the detection voltage $VD_i$ of the biasing circuit 20 of the FIG. 1 shown in "P", the returning to the stationary level after the noise application is delayed to a large extent. It could be seen from the above result that the voltage of the biasing circuit 21 is stabilized to the predetermined voltage faster due to the characteristic of the N-channel transistor, because the biasing circuit 21 of the FIG. 7 according to this embodiment uses the N-channel transistor on the side of the power supply voltage of the drive circuit 2.

As described above, the biasing circuit 21 according to this embodiment is possible to be settled and stabilized to the predetermined voltage faster with few changes of the detection voltage $VD_i$, even if there is a disturbance of the noise.

The sense amplifier circuit 100 of the semiconductor memory device having the biasing circuit 1 shown in FIG. 6 or the biasing circuit 21 shown in FIG. 7 are described above. However, the biasing circuit according to the present invention is not limited to the application to the sense amplifier circuit, the biasing circuit according to the present invention may be applied to a circuit in which the voltage to be outputted is rapidly increased, a stabilized constant voltage is held in a stationary state and the current flowing through the output side is detected.

Next, the semiconductor memory device with a biasing circuit according to the sixth embodiment of the present invention will be described in detail with reference to FIG. 13. FIG. 13 shows a sense amplifier circuit 100 in which the biasing circuit 31 according to this embodiment is provided.

The biasing circuit 31 is provided in the sense amplifier circuit 100 shown in FIG. 13 and contains the structure of the biasing circuit 1 shown in FIG. 6. However, comparing the biasing circuit 21 shown in FIG. 7, the sense amplifier circuit 100 is different in the point which inverters 304 and 314 are provided instead of the P-channel transistors 301 and 311. The sense amplifier circuit 100 has substantially the same structure as the sense amplifier circuit 100 shown in FIG. 7.

When the sense amplifier operation enable signal SAE 30 is set to the low level in the biasing circuit 31 of the sense circuit 10, the P-channel transistor 4 and the N-channel transistor 6 are both set to the ON state. As a result, the voltage on the signal line $FB_i$ is increased. In this case, the P-channel transistor 4 is first started rapidly and the P-channel transistor 4 mainly controls the gate of the N-channel transistor 3 so that the N-channel transistor 3 is set to the ON state. The voltage on the signal line $FB_i$ and the voltage VDIG on the digit line $DL_i$ are increased (precharging process).

Moreover, the drive voltage $VFB_i$ on the signal line $FB_i$ starts to be decreased because the voltage of the gate of the N-channel transistor 5 is increased so that the current flows through the N-channel transistor 5. When the drive voltage $VFB_i$ on the signal line FBi is decreased, the voltage VDIG is also decreased to decrease the drain current of the transistor 5. Therefore, the drive voltage $VFB_i$ is increased so that the voltage VDIG on the digit line $DL_i$ is increased. A series of these operations is repeated in the biasing circuit 31, so that the voltage on the signal line $FB_i$ reaches the predetermined voltage VDIG.

Because the gate of the N-channel transistor 6 is connected with an inversion signal of the signal SAE 30, when the signal SAE 30 is the low level, the high level is supplied. When the source voltage of the N-channel transistor 6 is decreased, the voltage supplied to the gate of the N-channel transistor 3 changes such that the N-channel transistor 6 is dominant, compared with the P-channel transistor 4.

The voltage of the N-channel transistor 3 is kept constant by the drive circuit 21. As a result, the voltage of the digit line $DL_i$ is kept constant and the detection voltage $VD_i$ is outputted by the data detecting circuit 201. At this time, in the reference the biasing circuit, the voltage on the reference digit line DLR is increased and the reference voltage VREF is outputted to the data detecting circuit 201. Therefore, the voltage difference between the detection voltage $VD_i$ and the reference voltage VREF is sensed by the data detecting circuit 201 (sensing process). In the sensing process, because the detection voltage $VD_i$ stabilized by the N-channel transistor 6 is obtained, the correct sensing process can be carried out.

In the above description, a floating gate-type MOSFET is described as an example. However, the present invention can be applied to the semiconductor memory device such as a mask ROM and an EPROM in which the predetermined bias voltage is applied to detect the current flowing through a memory cell so that the stored data in the memory cell can be read out.

What is claimed is:

1. A semiconductor memory device comprising:

a memory cell connected with a word line and a digit line via a control circuit;

an N-channel bias transistor supplying said memory cell via the control circuit with a bias voltage on said digit line in response to a drive voltage when said word line is activated; and a drive circuit including a P-channel transistor and an N-channel transistor connected to each other in parallel, and supplying said drive voltage to said bias transistor by said P-channel transistor and said N-channel transistor, wherein said P-channel transistor has a source which is operatively connected to a power supply potential, a gate which is operatively connected to a ground potential, and a drain which is operatively connected to said bias outputting circuit, wherein said N-channel transistor has a drain which is operatively connected to said power supply potential, a gate which is operatively connected to said power supply potential, and a source which is operatively connected to said bias outputting circuit, wherein an operation period of said drive circuit includes a first period and a second period following said first period, wherein said P-channel transistor is major to said N-channel transistor in said drive voltage for said first period and said P-channel transistor is minor to said N-channel transistor in said drive voltage for said second period, and change from said P-channel transistor to said N-channel transistor is gradually carried out, and wherein said P-channel transistor and said N-channel transistor are different from each other in size.

2. A semiconductor memory device according to claim 1, wherein said drive circuit further includes:

an N-channel control transistor having a drain which is connected to said drain of said P-channel transistor and said source of said N-channel transistor, a gate which is operatively connected to said bias voltage from said bias transistor, and a source which is operatively connected to a ground potential.

3. A semiconductor memory device according to claim 1, wherein said P-channel transistor is turned on when said bias voltage is much lower than a predetermined voltage and said N-channel transistor is turned on when said bias voltage is substantially the same as the predetermined voltage.

4. A semiconductor memory device according to claim 1, wherein a current ratio of said P-channel transistor to said N-channel transistor is in a range of 1:3 to 1:5.

5. A semiconductor memory device comprising:

a memory cell connected with a word line and a digit line via a control circuit;

an N-channel bias transistor supplying said memory cell via the control circuit with a bias voltage on said digit line in response to a drive voltage when said word line is activated; and a drive circuit including a P-channel transistor and an N-channel transistor connected to each other in parallel, and supplying said drive voltage to said bias transistor by said P-channel transistor and said N-channel transistor, wherein said P-channel transistor has a source which is operatively connected to a power supply potential, a gate which is operatively connected to a ground potential, and a drain which is operatively connected to said bias outputting circuit, wherein said N-channel transistor has a drain which is operatively connected to said power supply potential, a gate which is operatively connected to said power supply potential, and a source which is operatively connected to said bias outputting circuit, and wherein said supplying circuit further includes a second P-channel transistor having a source which is connected to said power supply potential, a gate which is operatively connected to said control signal, and a drain which is operatively connected to said drain of said N-channel transistor.

6. A semiconductor memory device comprising:

a memory cell connected with a word line and a digit line via a control circuit;

an N-channel bias transistor supplying said memory cell via the control circuit with a bias voltage on said digit line in response to a drive voltage when said word line is activated; and a drive circuit including a P-channel transistor and an N-channel transistor connected to each other in parallel, and supplying said drive voltage to said bias transistor by said P-channel transistor and said N-channel transistor, wherein said drive circuit feeds back a first gain to said P-channel transistor when a difference between said bias output and a predetermined voltage is larger than a first voltage and feeds back a second gain smaller than said first gain to said N-channel transistor when the difference between said bias output and a predetermined voltage is smaller than said first voltage.

* * * * *